US012625197B2

(12) United States Patent
Lei et al.

(10) Patent No.: US 12,625,197 B2
(45) Date of Patent: May 12, 2026

(54) UNDERGROUND CABLE PATH TESTER

(71) Applicant: Yongzhou Noyafa Electronic Co., Ltd., Yongzhou (CN)

(72) Inventors: Ming Lei, Yongzhou (CN); Jianping Zhang, Yongzhou (CN)

(73) Assignee: Yongzhou Noyafa Electronic Co., Ltd., Yongzhou (CN)

( * ) Notice: Subject to any disclaimer, the term of this patent is extended or adjusted under 35 U.S.C. 154(b) by 186 days.

(21) Appl. No.: 18/777,968

(22) Filed: Jul. 19, 2024

(65) Prior Publication Data

US 2025/0199088 A1 Jun. 19, 2025

(30) Foreign Application Priority Data

Dec. 15, 2023 (CN) .......................... 202323432162.6
Dec. 18, 2023 (CN) .......................... 202323452119.6

(51) Int. Cl.
*G01R 31/58* (2020.01)
*H03K 3/037* (2006.01)
*H03K 17/687* (2006.01)

(52) U.S. Cl.
CPC ............. *G01R 31/58* (2020.01); *H03K 3/037* (2013.01); *H03K 17/6871* (2013.01)

(58) Field of Classification Search
CPC ...... G01R 31/58; G01R 29/085; H03K 3/037; H03K 17/6871; G01V 3/06
See application file for complete search history.

(56) References Cited

U.S. PATENT DOCUMENTS

| | | | |
|---|---|---|---|
| 2004/0174153 A1* | 9/2004 | Benson .................. | G01R 31/67 |
| | | | 324/66 |
| 2008/0309315 A1* | 12/2008 | Li ........................... | G01V 3/165 |
| | | | 324/67 |
| 2009/0027061 A1* | 1/2009 | Curt ................... | H02J 13/1317 |
| | | | 324/539 |
| 2010/0246229 A1* | 9/2010 | Lu ....................... | H02M 1/4208 |
| | | | 363/127 |
| 2012/0204054 A1* | 8/2012 | Zerbe ........................ | G06F 1/10 |
| | | | 713/400 |

* cited by examiner

*Primary Examiner* — Alvaro E Fortich

(57) ABSTRACT

Disclosed in the present disclosure is an underground cable path tester, in which a first signal processing device is connected to a data port of a primary unit central control module, and a second signal processing device is connected to an output port of the first signal processing device; regarding the first signal processing device, data ports of a signal receiving module, a signal amplifying module, a phase-locked loop module, and a secondary unit central control module are sequentially connected; and regarding the second signal processing device, a probe, a filter module, an amplifier module, and an alarm module are sequentially connected.

15 Claims, 34 Drawing Sheets

UNDERGROUND CABLE PATH TESTER

CROSS REFERENCE TO RELATED APPLICATIONS

The present application claims the benefit of Chinese Patent Application Nos. 202323432162.6 filed on Dec. 15, 2023 and 202323452119.6 filed on Dec. 18, 2023. All the above are hereby incorporated by reference in their entirety.

FIELD

Disclosed in the present disclosure is an underground cable path finding device and particularly an underground cable path tester.

BACKGROUND

With the development of urbanization, all kinds of cables and pipelines are wired in a buried way, which renders the pipelines denser and more complex. Some cities have a long history of power grid construction, especially in some central and old urban areas, in which the medium and low-voltage power grid distribution capacity is insufficient.

How to find out the path of age-old power grid cables has become a necessary consideration for power grid renovation and construction. Existing technology requires that the low-voltage power grid must not be electrified for cable path detection, and the instrument is bulky, requires multiple operators, and needs to find the ends of the target cable to determine the path, which undoubtedly brings certain limitations to the power grid renovation and construction.

SUMMARY

In view of the above mentioned deficiencies of the prior art in which ordinary cable path testers are unable to determine the path of a cable line in an electrified condition, provided in the present disclosure is an underground cable path tester, which adds a set frequency signal to the power grid and receives and amplifies it through a receiving probe, so as to test the path of underground cables.

The technical solutions adopted by the present disclosure to solve the technical problems is as follows. An underground cable path tester, including a primary unit and a secondary unit, in which the primary unit includes a primary unit central control module, a first signal processing device, a second signal processing device, and a primary unit power module, the first signal processing device is connected to a data port of the primary unit central control module, the second signal processing device is connected to an output port of the first signal processing device, the primary unit power module is used to supply power for the primary unit, the second signal processing device is a signal transmitting interface when the first signal processing device is a signal transmitting module, and the second signal processing device is a signal emitting module when the first signal processing device is a signal processing module;

the secondary unit includes a secondary unit processing device and a secondary unit power module, the secondary unit processing device includes a first secondary unit processing device or a second secondary unit processing device, the first secondary unit processing device corresponds to the signal transmitting module, and the second secondary unit processing device corresponds to the signal processing module;

the first secondary unit processing device includes a secondary unit central control module, a signal receiving module, a signal amplifying module, and a phase-locked loop module, the signal receiving module is connected to the signal amplifying module, an output port of the signal amplifying module is connected to the phase-locked loop module, and the phase-locked loop module is connected to a data port of the secondary unit central control module;

the second secondary unit processing device includes a probe interface, a filter module, an amplifier module, and an alarm module, the probe interface is connected to an input port of the filter module, an output port of the filter module is connected to an input port of the amplifier module, and the output port of the amplifier module is connected to an input port of the alarm module; and the secondary unit power module is used to supply power for the secondary unit.

The technical solutions adopted by the present disclosure to solve its technical problems further include:

when the first signal processing device is the signal transmitting module, the first signal processing device includes a dual-D flip-flop U6, an operational amplifier U7, an electronic switch U108, a triode Q11, a triode Q13, and an isolation transformer TR1, an interior of the dual-D flip-flop U6 includes a D flip-flop U6-A and a D flip-flop U6-B, an interior of the operational amplifier U7 includes an operational amplifier U7-A and an operational amplifier U7-B, a data port of the central control module is connected to an input port of the D flip-flop U6-B, an output port of the D flip-flop U6-B is connected to an input port of the D flip-flop U6-A, an output port of the D flip-flop U6-A is connected to an input port of the operational amplifier U7-A, an output port of the operational amplifier U7-A is connected to an I/O port B of the electronic switch U108, the I/O port B of the electronic switch U108 is connected to an I/O port A of the electronic switch U108, the I/O port A of the electronic switch U108 is connected to an input port of the operational amplifier U7-B, a 9.0V power supply is connected to ground via a resistor R56 and a resistor R55, a common end between the resistor R56 and the resistor R55 is connected to the I/O port A of the electronic switch U108, a collector of the triode Q11 is connected to a 9.0V power supply, an emitter of the triode Q11 is connected to an emitter of the triode Q13, a collector of the triode Q13 is grounded, a base of the triode Q11 is connected to a base of the triode Q13, an output port of the operational amplifier U7-B is connected to the base of the triode Q11 and the base of the triode Q13, the output port of the operational amplifier U7-B is connected to the emitter of the triode Q11 and the emitter of the triode Q13 via a resistor R64, the emitter of the triode Q11 and the emitter of the triode Q13 are connected to a primary coil of the isolation transformer TR1 through a capacitor C11 and an inductor L3 connected in series, and the secondary coil of the isolation transformer TR1 is connected to an interface J3-1;

when the first signal processing device is the signal processing module, the signal processing module includes an MOS transistor Q207, an MOS transistor Q204, an MOS transistor Q205, a triode Q206 and a triode Q203, a gate of the MOS transistor Q207 is a signal input port of the signal processing module, the gate of the MOS transistor Q207 is connected to a data port of the central control module via a resistor R201, a source of the MOS transistor Q207 is grounded, a drain of the MOS transistor Q207 is connected to a +9V power supply via a resistor R202, gates of the MOS transistor Q204 and the MOS transistor Q205 are connected to the drain of the MOS transistor Q207 respectively, a drain of the MOS transistor Q204 is connected to a +9V power supply, a drain of the MOS transistor Q205 is grounded, a source of the MOS transistor Q204 is connected to a source of the MOS transistor Q205, the source of the MOS transistor Q204 is connected to a base of the triode Q206 via a resistor R203 and a resistor R204 connected in series, a capacitor C201 and an inductor L201 are connected in series, the capacitor C201 and the inductor L201 connected in series are connected to a resistor R204 in parallel, a base of the triode Q206 is connected to a +9V power supply via a resistor R205, an emitter of the triode Q206 is grounded via a resistor R206, a collector of the triode Q206 is connected to a +9V power supply via a resistor R201 and an inductor L202 connected in series, the collector of the triode Q206 is connected to a base of the triode Q203 via a capacitor C202 and an inductor L203 connected in series, an emitter of the triode Q203 is grounded via a variable resistor VR1, a center tap of the variable resistor VR1 is grounded via a resistor R207, a collector of the triode Q203 is connected to a +9V power supply via an inductor L204, a base of the triode Q203 is connected to the signal emitting module via a resistor R208, an inductor L205, a capacitor C203, and a thermistor PTC1 sequentially connected in series, a common end between the resistor R208 and the inductor L205 is connected to the collector of the triode Q203, and a common end between the capacitor C203 and the thermistor PTC1 is grounded via a capacitor C204 and an inductor L206 connected in series.

When the first signal processing device is a signal transmitting module, a data port of the primary unit central control module is connected with a primary unit electronic control switch, the primary unit electronic control switch includes a triode Q31, a triode Q32, and a triode Q33, bases of the triode Q31, the triode Q32, and the triode Q33 are connected to data ports of the primary unit central control module respectively, emitters of the triode Q31, the triode Q32, and the triode Q33 are grounded respectively, and collectors of the triode Q31, the triode Q32, and the triode Q33 are connected control ports of an electronic switch U108 respectively.

When the first signal processing device is the signal transmitting module, the primary unit further includes a signal feedback module, the signal feedback module includes an operational amplifier U1, an operational amplifier U9, an operational amplifier U12-A, and an operational amplifier U12-B, the operational amplifier U1, operational amplifier U9, operational amplifier U12-A, and operational amplifier U12-B are connected in sequence to form a four-stage amplification system, a signal input port of the signal feedback module is connected to a primary coil of an isolation transformer TR1, and an output port of the signal feedback module is connected to a data port of the primary unit central control module.

When the first signal processing device is a signal transmitting module, the signal receiving module includes a receiving coil L31, a receiving coil L32, and a receiving coil L33, the signal amplifying module includes an X-axis primary amplifying module, a Y-axis primary amplifying module, a Z-axis primary amplifying module, an X-axis secondary amplifying module, a Y-axis secondary amplifying module, and a Z-axis secondary amplifying module, and the phase-locked loop module includes an X-axis phase-locked loop module, a Y-axis phase-locked loop module, and a Z-axis phase-locked loop module;

the receiving coil L31 is connected to an input port of the X-axis primary amplifying module, the X-axis primary amplifying module includes an operational amplifier U1-A and an operational amplifier U1-B, the operational amplifier U1-A and the operational amplifier U1-B are connected to form a two-stage amplification circuit, the X-axis primary amplifying module is connected to the X-axis secondary amplifying module via an interface J1, the X-axis secondary amplifying module includes an operational amplifier U8-A and an operational amplifier U8-B, the operational amplifier U8-A and the operational amplifier U8-B are connected to form a two-stage amplification circuit, one branch of an output port of the X-axis secondary amplifying module is connected to a data port of the secondary unit central control module, another branch of the output port of the X-axis secondary amplifying module is connected to an input port of the X-axis phase-locked loop module, an output port of the X-axis phase-locked loop module is connected to a data port of the secondary unit central control module, a clock signal port of the X-axis phase-locked loop module is connected to an X-axis channel selector U20, and a control port of the X-axis channel selector U20 is connected to a data port of the secondary unit central control module;

the receiving coil L32 is connected to an input port of the Y-axis primary amplifying module, the Y-axis primary amplifying module includes an operational amplifier U2-A and an operational amplifier U2-B, the operational amplifier U2-A and the operational amplifier U2-B are connected to form a two-stage amplification circuit, the Y-axis primary amplifying module is connected to the Y-axis secondary amplifying module via an interface J1, the Y-axis secondary amplifying module includes an operational amplifier U9-A and an operational amplifier U9-B, the operational amplifier U9-A and the operational amplifier U9-B are connected to form a two-stage amplification circuit, one branch of an output port of the Y-axis secondary amplifying module is connected to a data port of the secondary unit central control module, another branch of the output port of the Y-axis secondary amplifying module is connected to an input port of the Y-axis phase-locked loop module, an output port of the Y-axis phase-locked loop module is connected to a data port of the secondary unit central control module, a clock signal port of the Y-axis phase-locked loop module is connected to an Y-axis channel selector U13, and a control port of the Y-axis channel selector U13 is connected to a data port of the secondary unit central control module; and the receiving coil L33 is connected to an input port of the Z-axis primary amplifying module, the Z-axis primary amplifying module includes an operational amplifier U3-A and an operational amplifier U3-B, the operational amplifier U3-A and the operational amplifier U3-B are connected to form a two-stage amplification circuit, the Z-axis primary amplifying module is connected to the Z-axis secondary amplifying module via an interface J1, the Z-axis secondary amplifying module includes an operational amplifier U10-A and an operational amplifier U10-B, the operational amplifier U10-A and the operational amplifier U10-B are connected to form a two-stage amplification circuit, one branch of an output port of the Z-axis secondary amplifying module is connected to a data port of the secondary unit central control module, another branch of the output port of the Z-axis secondary amplifying module is connected to an input port of the Z-axis phase-locked loop module, an output port of the Z-axis phase-locked loop module is connected to a data port of the secondary unit central control module, a clock signal port of the Z-axis phase-locked loop module is connected to an Z-axis channel selector U10, and a control port of the Z-axis channel selector U10 is connected to a data port of the secondary unit central control module.

When the first signal processing device is the signal transmitting module, the secondary unit further includes a wireless voltage detection module, the wireless voltage detection module includes an NCV coil, an operational amplifier U4-B, and an operational amplifier U14, the NCV coil is connected to an input port of the operational amplifier U4-B, an output of the operational amplifier U4-B is connected to an input port of the operational amplifier U14, and an output port of the operational amplifier U14 is connected to a data port of the secondary unit central control module.

When the first signal processing device is the signal transmitting module, a data port of the secondary unit central control module is connected with an audio amplifier chip U15, and an output port of the audio amplifier chip U15 is connected with a speaker; and when the first signal processing device is the signal processing module, the alarm module includes an audio power amplifier U101 and a speaker BZ1, an output port of the amplifier module is connected to a signal input port of the audio power amplifier U101, and an output port of the audio power amplifier U101 is connected to the speaker BZ1.

When the first signal processing device is the signal transmitting module, a crystal oscillator module is connected between an OSC_IN interface and an OSC_OUT interface of the primary unit central control module, a power-on reset module is connected to an NRST interface of the primary unit central control module, the power-on reset module includes a capacitor C299 and a resistor R355, the capacitor C299 is connected between ground and the NRST interface of the primary unit central control module, and the resistor R355 is connected between a positive power supply and the NRST interface of the primary unit central control module; a crystal oscillator module is connected between an OSC_IN interface and an OSC_OUT interface of the secondary unit central control module, a secondary unit power-on reset module is connected to an NRST interface of the secondary unit central control module, the secondary unit power-on reset module includes a capacitor C290 and a resistor R300, the capacitor C290 is connected between ground and the NRST interface of the secondary unit central control module, and the resistor R300 is connected between a positive power supply and the NRST interface of the secondary unit central control module; a data port of the primary unit central control module is connected with a primary unit display module, and a data port of the secondary unit central control module is connected with a secondary unit display module; a primary unit backlight module is connected to the data port of the primary unit central control module, the primary unit backlight module includes a current limiting resistor R22, an electronic control switch Q10, and a backlight interface CON2, the current limiting resistor R22, the backlight interface CON2, and the electronic control switch Q10 are sequentially connected in series between the positive power supply and the ground, and a control port of the electronic control switch Q10 is connected to a data port of the primary unit central control module; a secondary unit backlight module is connected to the data port of the secondary unit central control module, the secondary unit backlight module includes a current limiting resistor R22, an electronic control switch Q10, and a backlight interface CON2, the current limiting resistor R22, the backlight interface CON2, and the electronic control switch Q10 are sequentially connected in series between the positive power supply and the ground, and a control port of the electronic control switch Q10 is connected to a data port of the secondary unit central control module; a primary unit key module is connected to the data port of the primary unit central control module, in which the primary unit key module includes a key switch S1, a key switch S2, a key switch S3, a key switch S4, a key switch S5, a key switch S6, a key switch S7, and a key switch S8, and the key switch S1, the key switch S2, the key switch S3, the key switch S4, the key switch S5, the key switch S6, the key switch S7, and the key switch S8 are connected between the data port of the primary unit central control module and ground, respectively; a secondary unit key module is connected to the data port of the secondary unit central control module, in which the secondary unit key module includes a key switch S1, a key switch S2, a key switch S3, a key switch S4, a key switch S5, a key switch S6, a key switch S7, and a key switch S8, and the key switch S1, the key switch S2, the key switch S3, the key switch S4, the key switch S5, the key switch S6, the key switch S7, and the key switch S8 are connected between the data port of the secondary unit central control module and ground, respectively; a primary unit buzzer module is connected to the data port of the primary unit central control module, in which the primary unit buzzer module includes a buzzer and an electronic control switch Q12, the buzzer and the electronic control switch Q12 are connected in series between the positive power supply and ground, and a control port of the electronic control switch Q12 is connected to a data port of the primary unit central control module; a secondary unit buzzer module is connected to the data port of the secondary unit central control module, in which the secondary unit buzzer module includes a buzzer and an electronic control switch Q12, the buzzer and the electronic control switch Q12 are connected in series between the positive power supply and ground, and a control port of the electronic control switch Q12 is connected to a data port of the secondary unit central control module; a primary unit work indicator module is connected to the data port of the primary unit central control module, in which the primary unit work indicator module includes a current limiting resistor R30, a current limiting resistor R31, a current limiting resistor R32, an electronic control switch Q9, an indicator light LED1, an indicator light LED2, and an indicator light LED3, the current limiting resistor R32 and the indicator light LED1 are connected in series, the current limiting resistor R31 and the indicator light LED2 are connected in series, the current limiting resistor R30 and the indicator light LED3 are connected in series, the series-connected current limiting resistor R32 and the indicator light LED1, the series-connected current limiting resistor R31 and the indicator light LED2, and the series-connected current limiting resistor R30 and the indicator light LED3 are connected in parallel and are connected between the positive power supply and ground via the electronic control switch Q9, and a control port of the electronic control switch Q9 is connected to a data port of the primary unit central control module; and a secondary unit work indicator module is connected to the data port of the secondary unit central control module, in which the secondary unit work indicator module includes a current limiting resistor R30, a current limiting resistor R31, a current limiting resistor R32, an electronic control switch Q9, an indicator light LED1, an indicator light LED2, and an indicator light LED3, the current limiting resistor R32 and the indicator light LED1 are connected in series, the current limiting resistor R31 and the indicator light LED2 are connected in series, the current limiting resistor R30 and the indicator light LED3 are connected in series, the series-connected current limiting resistor R32 and the indicator light LED1, the series-connected current limiting resistor R31 and the indicator light LED2, and the series-connected current limiting resistor R30 and the indicator light LED3 are connected in parallel and are connected between the positive power supply and ground via the electronic control switch Q9, and a control port of the electronic control switch Q9 is connected to a data port of the secondary unit central control module.

The primary unit power module includes a primary unit USB interface, a primary unit charging management module, a primary unit lithium battery, and a primary unit power management device, the primary unit USB interface is connected to a power input port of the primary unit charging management module, the primary unit lithium battery is connected to a power output port of the primary unit charging management module, and the primary unit lithium battery is charged via the primary unit USB interface;

a positive electrode of the primary unit lithium battery is connected with a primary unit battery voltage detection module, the primary unit battery voltage detection module includes two resistors connected in series, and a common end between two resistors is connected to a data port of the primary unit central control module; when the first signal processing device is the signal transmitting module, a positive electrode of the secondary unit lithium battery is connected with a secondary unit battery voltage detection module, the secondary unit battery voltage detection module includes two resistors connected in series, and a common end between two resistors is connected to a data port of the secondary unit central control module;

when the first signal processing device is a signal transmitting module, the primary unit power management device includes a primary unit boost chip U105 and a primary unit voltage regulator chip U104, a power input port of the primary unit boost chip U105 is connected to the primary unit lithium battery, a voltage of the primary unit lithium battery is converted to +9.0V for power supply via the primary unit boost chip U105, and +9.0V voltage is regulated to +3.3V via the primary unit voltage regulator chip U104 and then output to the primary unit for power supply; and when the first signal processing device is the signal processing module, the primary unit power management device includes a primary unit power management module and a voltage regulator module.

The secondary unit power module includes a secondary unit USB interface, a secondary unit charging management module, a secondary unit lithium battery, and a secondary unit power management device, the secondary unit USB interface is connected to a power input port of the secondary unit charging management module, the secondary unit lithium battery is connected to a power output port of the secondary unit charging management module, and the secondary unit lithium battery is charged via the secondary unit USB interface;

when the first signal processing device is a signal transmitting module, the secondary unit power management device includes an MOSFET chip Q106, a secondary unit boost chip U102, a first secondary unit voltage regulator chip U114, and a second secondary unit voltage regulator chip U116, a power input port of the secondary unit boost chip U102 is connected to the secondary unit lithium battery via the MOSFET chip Q106, a voltage of the secondary unit lithium battery is converted to +9.0V for power supply via the secondary unit boost chip U102, +9.0V voltage is regulated to +5.0V via the first secondary unit voltage regulator chip U114 and then output to the primary unit for power supply, and a voltage of the secondary unit lithium battery is regulated to +3.3V via the second secondary unit voltage regulator chip U116 and then output to the secondary unit for power supply;

when the first signal processing device is the signal processing module, the secondary unit power management device includes a secondary unit power management module.

When the first signal processing device is the signal processing module, the secondary unit further includes a secondary unit charging indicator module, the secondary unit charging indicator module includes a resistor R209 and a light-emitting diode LED1-RED, and the resistor R209 and the light-emitting diode LED1-RED are connected in series between a BTA_CHAR interface of a secondary unit charging management module and a positive power port of a USB interface.

When the first signal processing device is the signal processing module, the secondary unit power module further includes a +9V battery, a switch SW1, a resistor R210, and a light-emitting diode LED are sequentially connected in series between a positive electrode and a negative electrode of the +9V battery, a switch SW2 is connected between the negative electrode of the +9V battery and ground, the positive electrode of the +9V battery is connected to a source of an MOS transistor Q208, a drain of the MOS transistor Q208 outputs a +9V power supply, a gate of the MOS transistor Q208 is connected to a collector of a triode Q209 via a resistor R211, an emitter of the triode Q209 is grounded, a base of the triode Q209 is connected to a common end between a resistor R212 and a resistor R213, the resistor R212 and the resistor R213 are connected in series between the positive electrode of the +9V battery and ground, and a resistor R214 and a light-emitting diode LED2-RED are connected in series between the positive electrode of the +9V battery and ground.

When the first signal processing device is the signal processing module, the primary unit further includes a power-on indicator module, the power-on indicator module includes a bi-color light-emitting diode LED100 and an MOS transistor Q210, a gate of the MOS transistor Q210 is connected to a BTA_CHAR interface of the primary unit charging management module, a source of the MOS transistor Q210 is connected to a positive power port of a USB interface, a drain of the MOS transistor Q210 is connected to one bi-color light-emitting diode LED100, and the other bi-color light-emitting diode LED100 is connected to a +9V power supply.

When the first signal processing device is the signal processing module, the primary unit further includes a switch SW11, an output port of the primary unit power management module is connected to a work indicator LED11 via the switch SW11, and the work indicator LED11 is connected to the signal transmitting module.

When the first signal processing device is the signal processing module, the probe interface is grounded via a variable resistor VR2, a center tap of the variable resistor VR2 is grounded via a capacitor C205, a resistor R215, and a capacitor C206 sequentially connected in series, a resistor R216 and a capacitor C207 are connected in series between a +9V power supply and ground, a common end between the resistor R216 and the capacitor C207 is connected to a common end between the resistor R215 and the capacitor C206, the capacitor C205 and the resistor R215 are connected to a base of a triode Q211, an emitter of the triode Q211 is grounded via a resistor R217, a collector of the triode Q211 is connected to a +9V power supply via a resistor R218, the collector of the triode Q211 is connected to a port of a primary coil of an intermediate-frequency transformer TP1, an opposite port of the primary coil of the intermediate-frequency transformer TP1 is connected to a +9V power supply, a port of a secondary coil of the intermediate-frequency transformer TP1 is connected to a +9V power supply via a resistor R219, the same port thereof is further grounded via a resistor R220, an opposite port of the secondary coil of the intermediate-frequency transformer TP1 is connected to a base of a triode Q212, an emitter of the triode Q212 is grounded via a resistor R221, a collector of the triode Q212 is connected to a port of a primary coil of the intermediate-frequency transformer TP2, an opposite port of the primary coil of the intermediate-frequency transformer TP2 is connected to a +9V power supply, a capacitor C208 is connected in parallel between two ports of the primary coil of the intermediate-frequency transformer TP2, a port of a secondary coil of the intermediate-frequency transformer TP2 is grounded via a capacitor C209, the same port thereof is further connected to a base of a triode Q213 via a resistor R222, an opposite port of the secondary coil of the intermediate-frequency transformer TP2 is connected to a base of a triode Q214, an emitter of the triode Q214 is grounded via a resistor R223, a collector of the triode Q214 is connected to a +9V power supply via a resistor R224, a collector of the triode Q213 is connected to a +9V power supply, an emitter of the triode Q213 is connected to the amplifier module via a resistor R225, a resistor R226, and a diode D3 connected in series, and the capacitor C210 is connected in parallel to the series-connected resistor R225 and the resistor R226.

The beneficial effects of the present disclosure are as follows. The present disclosure allows a set frequency signal to be added to the power grid, by receiving and amplifying the probe signal, testing the underground cable path, regardless of whether the underground cable is electrified or not, the cable path is detectable, and the primary unit and the secondary unit adopt a small and compact structural design, which solves the deficiencies of the previous need for bulky instruments and equipment, multi-person operation and the need to find the ends of the target cable in order to determine the path.

The present disclosure is further described below in conjunction with the attached drawings and the specific implementations.

DETAILED DESCRIPTION OF THE EMBODIMENTS

Figure 1:
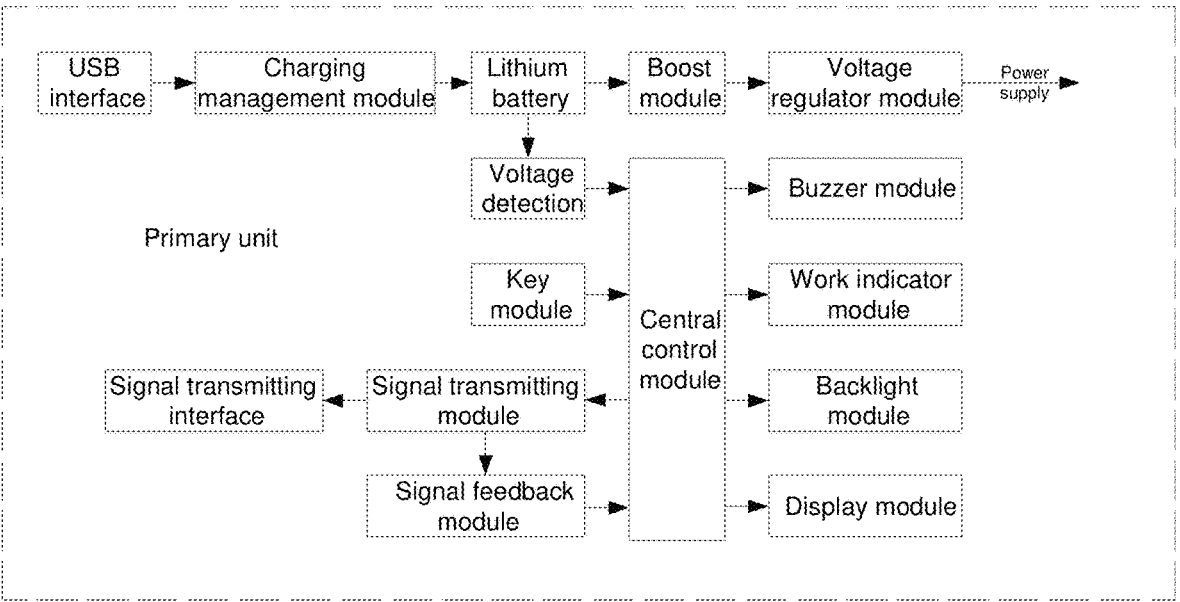
FIG. 1 is a circuit block diagram of the present invention when the first signal processing device is the signal transmitting module.
Figure 1:
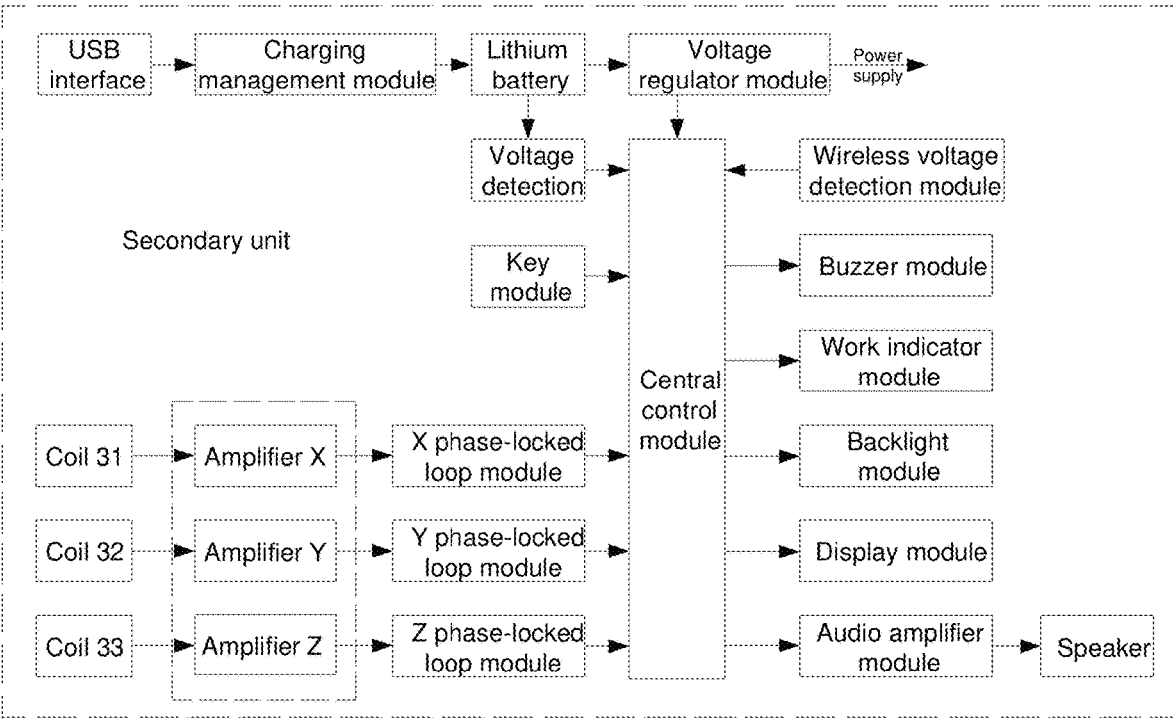

The present embodiment is a preferred embodiment of the disclosure, and any other principle and basic structure that is the same or similar to the present embodiment is within the scope of protection of the present disclosure.

Referring to FIGS. 1-49, included in the present disclosure is mainly a primary unit and a secondary unit, in which the primary unit is mainly an emitting circuit, and the secondary unit is, also called as cell phone secondary unit, mainly a receiving circuit.

The primary unit includes a primary unit central control module, a first signal processing device, a second signal processing device, and a primary unit power module, the first signal processing device is connected to a data port of the primary unit central control module, the second signal processing device is connected to an output port of the first signal processing device, the primary unit power module is used to supply power for the primary unit, the second signal processing device is a signal transmitting interface when the first signal processing device is a signal transmitting module, and the second signal processing device is a signal emitting module when the first signal processing device is a signal processing module.

Specifically, the signal transmitting module is connected to a data port of the primary unit central control module, the signal transmitting interface is connected to an output port of the signal transmitting module, the primary unit central control module outputs a clock signal to the signal transmitting module, and the clock signal is processed by the signal transmitting module and transmitted from the signal transmitting interface. The signal processing module is connected to the data port of the central control module, the central control module transmits a PWM wave to the signal processing module, the signal emitting module is connected to the signal processing module, and the PWM wave is amplified by the signal processing module and transmitted from the signal emitting module; the primary unit power module is used to supply power for the primary unit;

the secondary unit includes a secondary unit processing device and a secondary unit power module, the secondary unit processing device includes a first secondary unit processing device or a second secondary unit processing device, the first secondary unit processing device corresponds to the signal transmitting module, and the second secondary unit processing device corresponds to the signal processing module;

the first secondary unit processing device includes a secondary unit central control module, a signal receiving module, a signal amplifying module, and a phase-locked loop module, the signal receiving module is connected to the signal amplifying module, an output port of the signal amplifying module is connected to the phase-locked loop module, and the phase-locked loop module is connected to a data port of the secondary unit central control module;

the second secondary unit processing device includes a probe interface, a filter module, an amplifier module, and an alarm module, the probe interface is connected to an input port of the filter module, an output port of the filter module is connected to an input port of the amplifier module, and the output port of the amplifier module is connected to an input port of the alarm module; and the signal received by the signal receiving module is transmitted to the signal amplifier module, amplified by the signal amplifier module, transmitted to the phase-locked loop module for processing, processed by the phase-locked loop module and transmitted to the secondary unit central control module, and the secondary unit power module is used to supply power for the secondary unit.

Figure 2:
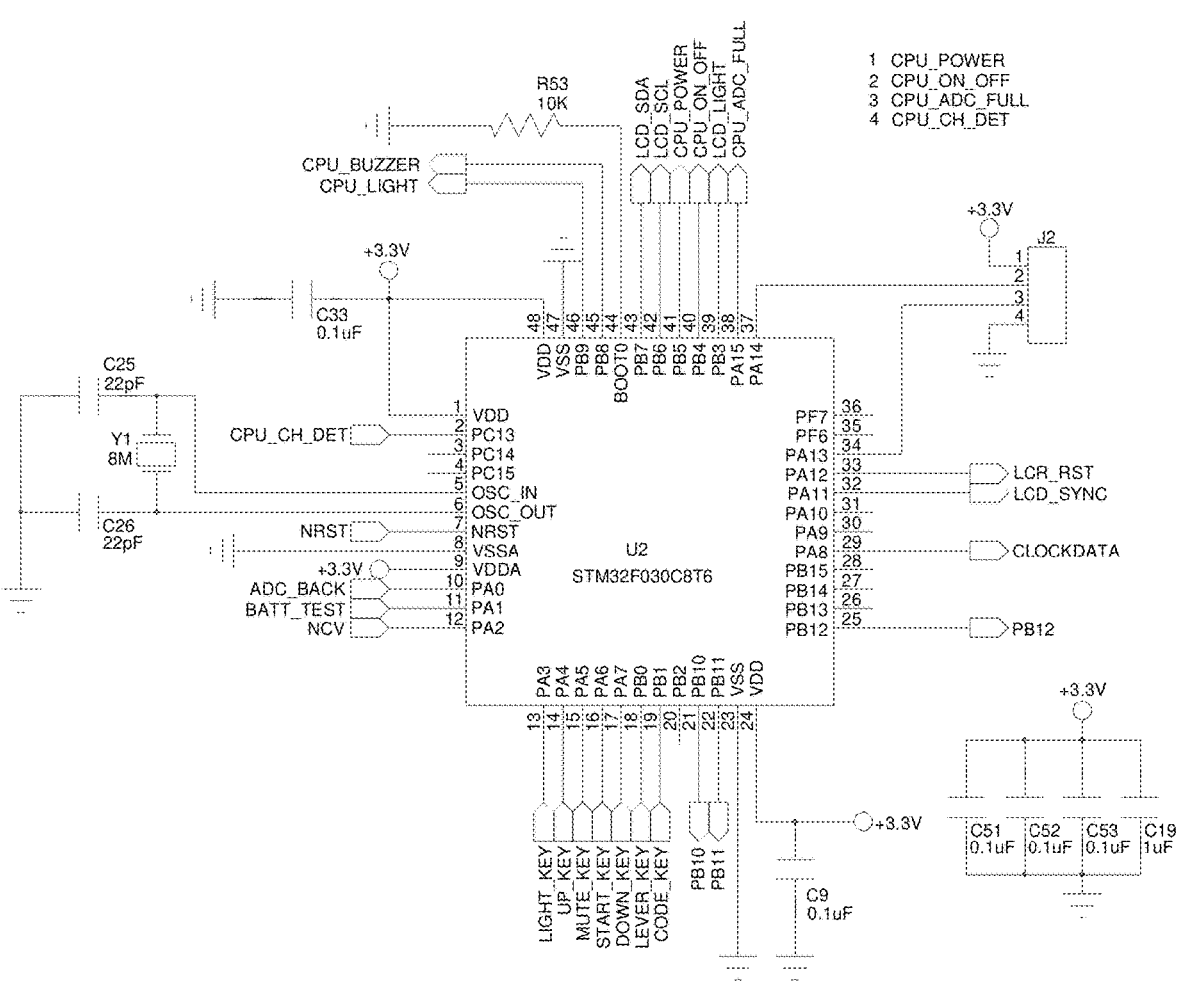
FIG. 2 is a circuit diagram of the primary unit central control module of the present invention when the first signal processing device is the signal transmitting module.
Figure 7:
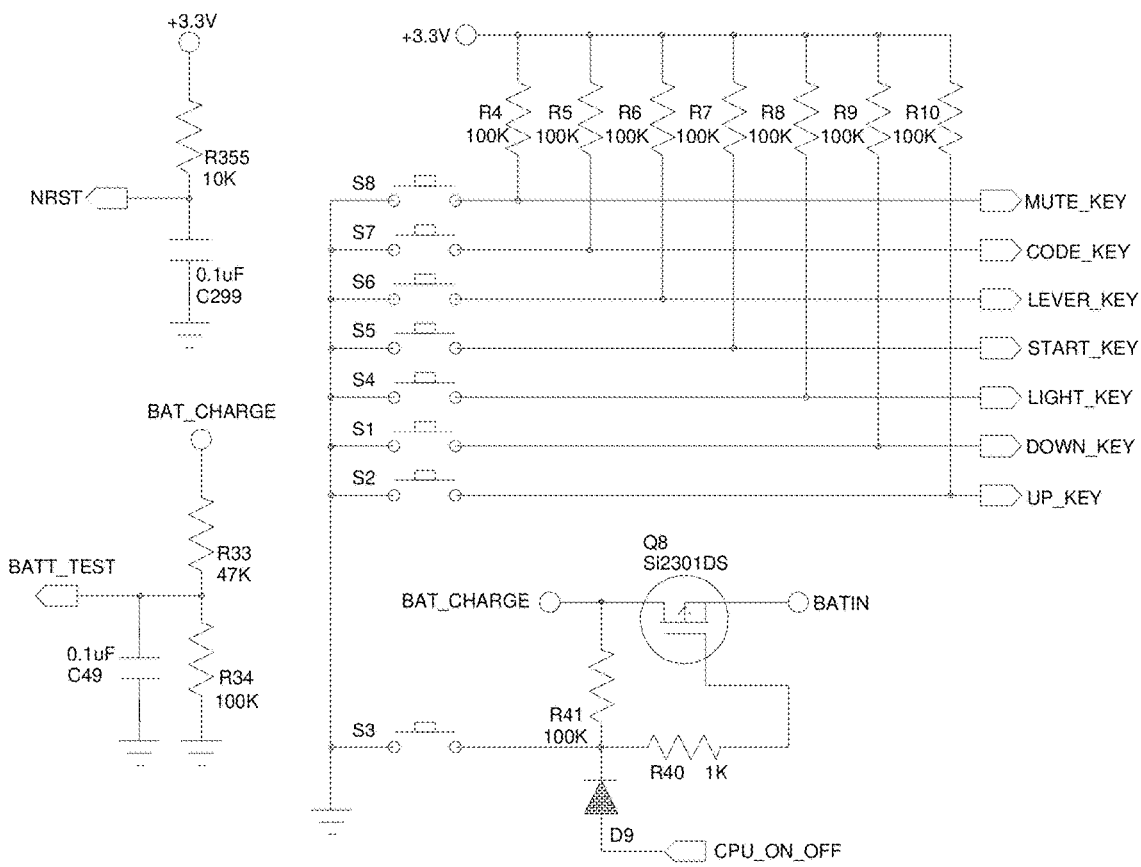
FIG. 7 is a circuit diagram of the primary unit key module of the present invention when the first signal processing device is the signal transmitting module.
Figure 35:
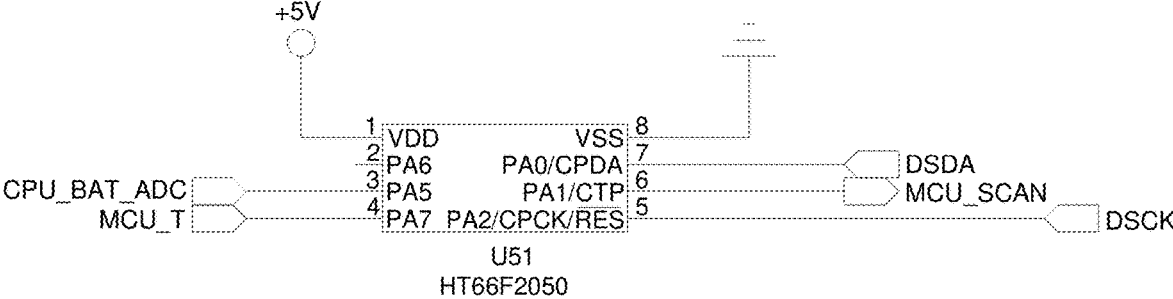
FIG. 35 is a circuit diagram of the primary unit central control module of the present invention when the first signal processing device is the signal processing module.

In the present embodiment, referring to FIGS. 2, 7, and 35, when the first signal processing device is the signal transmitting module, the primary central control module adopts an MCU chip of model STM32F030C8T6; and when the first signal processing device is the signal processing module, the central control module adopts a small microcontroller U51 of model HT66F2050. For specific implementations, other models of chips may also be used instead. When the first signal processing device is a signal transmitting module, a crystal oscillator module is connected between an OSC_IN interface and an OSC_OUT interface of the primary unit central control module, the crystal oscillator module adopts a quartz crystal oscillator of 8 MHz, and the crystal oscillator module is specifically selected according to the primary unit central control module. A power-on reset module is connected to an NRST interface of the primary unit central control module, and the power-on reset module includes capacitor C299 and resistor R355, capacitor C299 is connected between ground and the NRST interface of the central control module, and resistor R355 is connected between the NRST interface of the central control module and a positive power supply (i.e., +3.3V).

Figure 8:
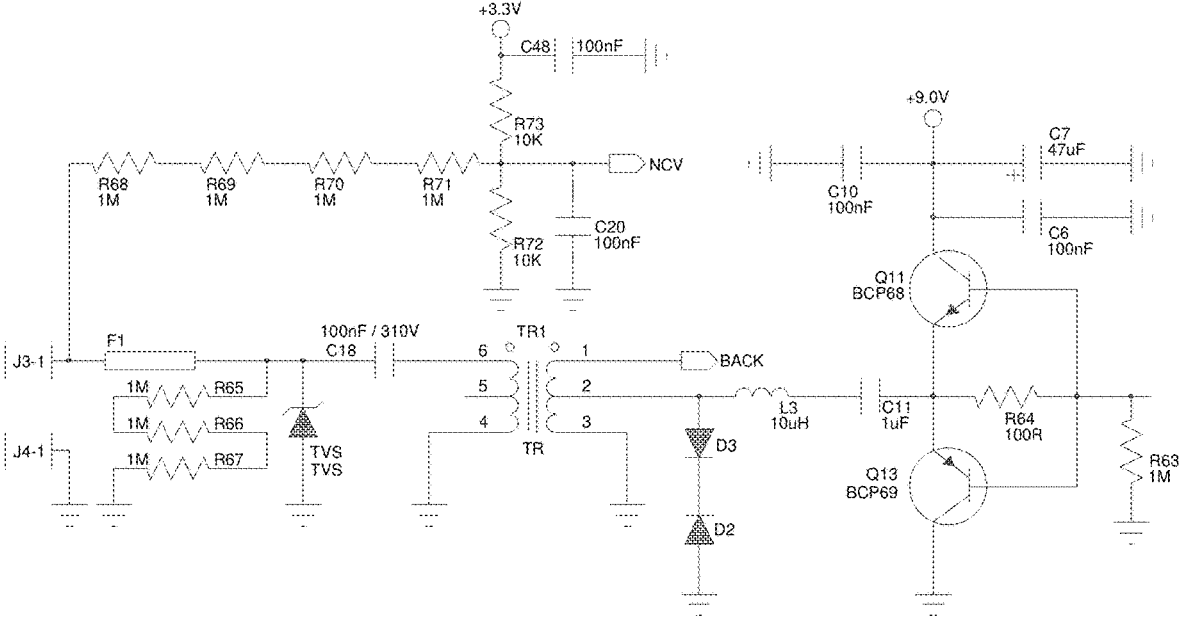
FIG. 8 is a circuit diagram of the primary unit signal transmitting interface of the present invention when the first signal processing device is the signal transmitting module.
Figure 9:
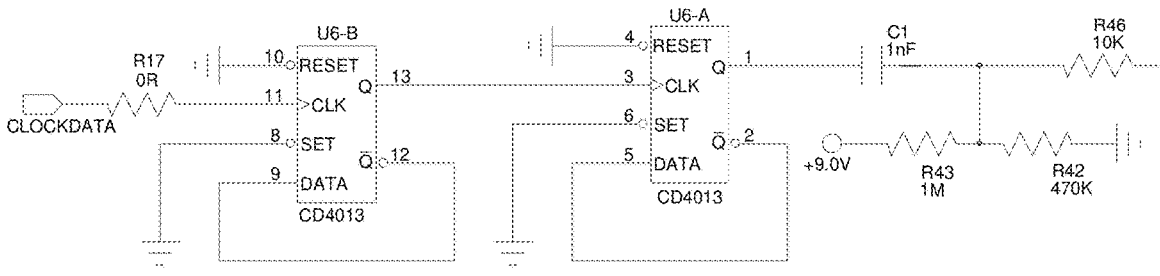
FIG. 9 is a circuit diagram of a first part of the primary unit signal transmitting module of the present invention when the first signal processing device is the signal transmitting module.
Figure 10:
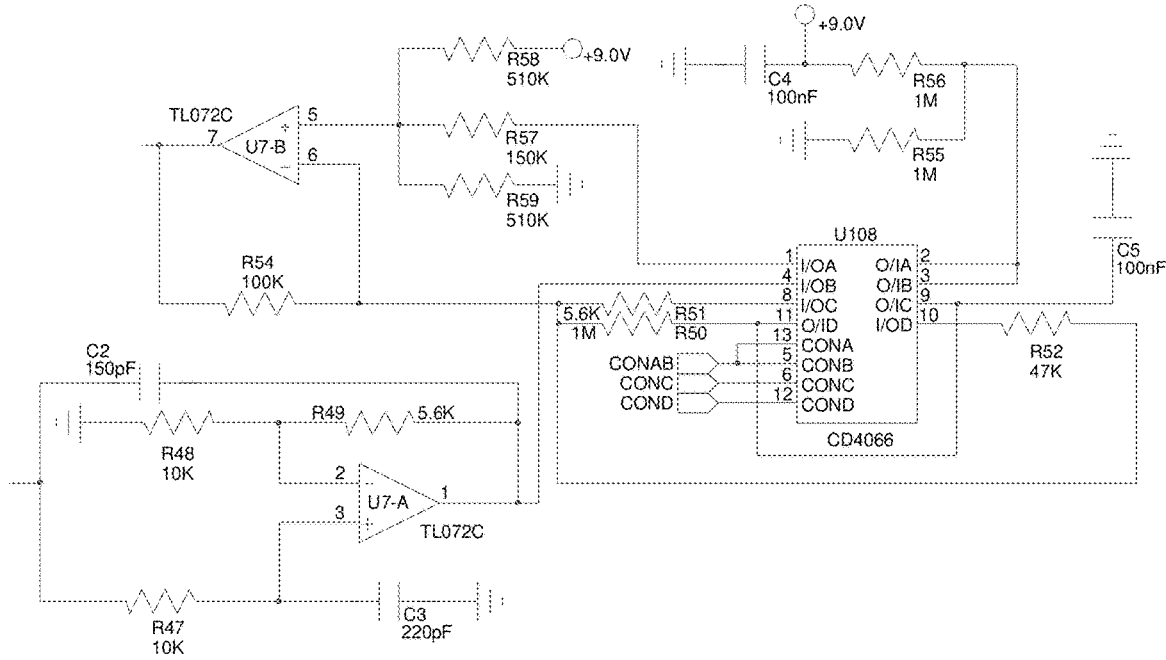
FIG. 10 is a circuit diagram of the primary unit signal amplifying module of the present invention when the first signal processing device is the signal transmitting module.

In the present embodiment, referring to FIGS. 8-10, when the first signal processing device is the signal transmitting module, the signal transmitting interface adopts an interface J3-1, the first signal processing device includes a dual-D flip-flop U6, an operational amplifier U7, an electronic switch U108, a triode Q11, a triode Q13, and an isolation transformer TR1, an interior of the dual-D flip-flop U6 includes a D flip-flop U6-A and a D flip-flop U6-B, an interior of the operational amplifier U7 includes an operational amplifier U7-A and an operational amplifier U7-B, a data port of the central control module is connected to an input port of the D flip-flop U6-B, an output port of the D flip-flop U6-B is connected to an input port of the D flip-flop U6-A, an output port of the D flip-flop U6-A is connected to an input port of the operational amplifier U7-A, an output port of the operational amplifier U7-A is connected to an I/O port B of the electronic switch U108, the I/O port B of the electronic switch U108 is connected to an I/O port A of the electronic switch U108, the I/O port A of the electronic switch U108 is connected to an input port of the operational amplifier U7-B, a 9.0V power supply is connected to ground via a resistor R56 and a resistor R55, a common end between the resistor R56 and the resistor R55 is connected to the I/O port A of the electronic switch U108, a collector of the triode Q11 is connected to a 9.0V power supply, an emitter of the triode Q11 is connected to an emitter of the triode Q13, a collector of the triode Q13 is grounded, a base of the triode Q11 is connected to a base of the triode Q13, an output port of the operational amplifier U7-B is connected to the base of the triode Q11 and the base of the triode Q13, the output port of the operational amplifier U7-B is connected to the emitter of the triode Q11 and the emitter of the triode Q13 via a resistor R64, the emitter of the triode Q11 and the emitter of the triode Q13 are connected to a primary coil of the isolation transformer TR1 through a capacitor C11 and an inductor L3 connected in series, and the secondary coil of the isolation transformer TR1 is connected to an interface J3-1. The clock signal from the central control module is transmitted to the input port of the D flip-flop U6-B, frequency adjusted by the dual-D flip-flop U6, and then input to the operational amplifier U7 for amplifying the signal. The central control module controls the amplitude and timing of the output signal by controlling the dual-D flip-flop U6 and the operational amplifier U7, the push-pull circuit by connecting the triode Q11 and the triode Q13 improves load capacity and stabilizes output, so as to be isolated from the electrified cable via the isolation transformer TR1 and transmit the output signal to the output probe, and a final emitted signal is formed with positive and negative polarities, with adjustable timing, and with adjustable amplitude.

Figure 36:
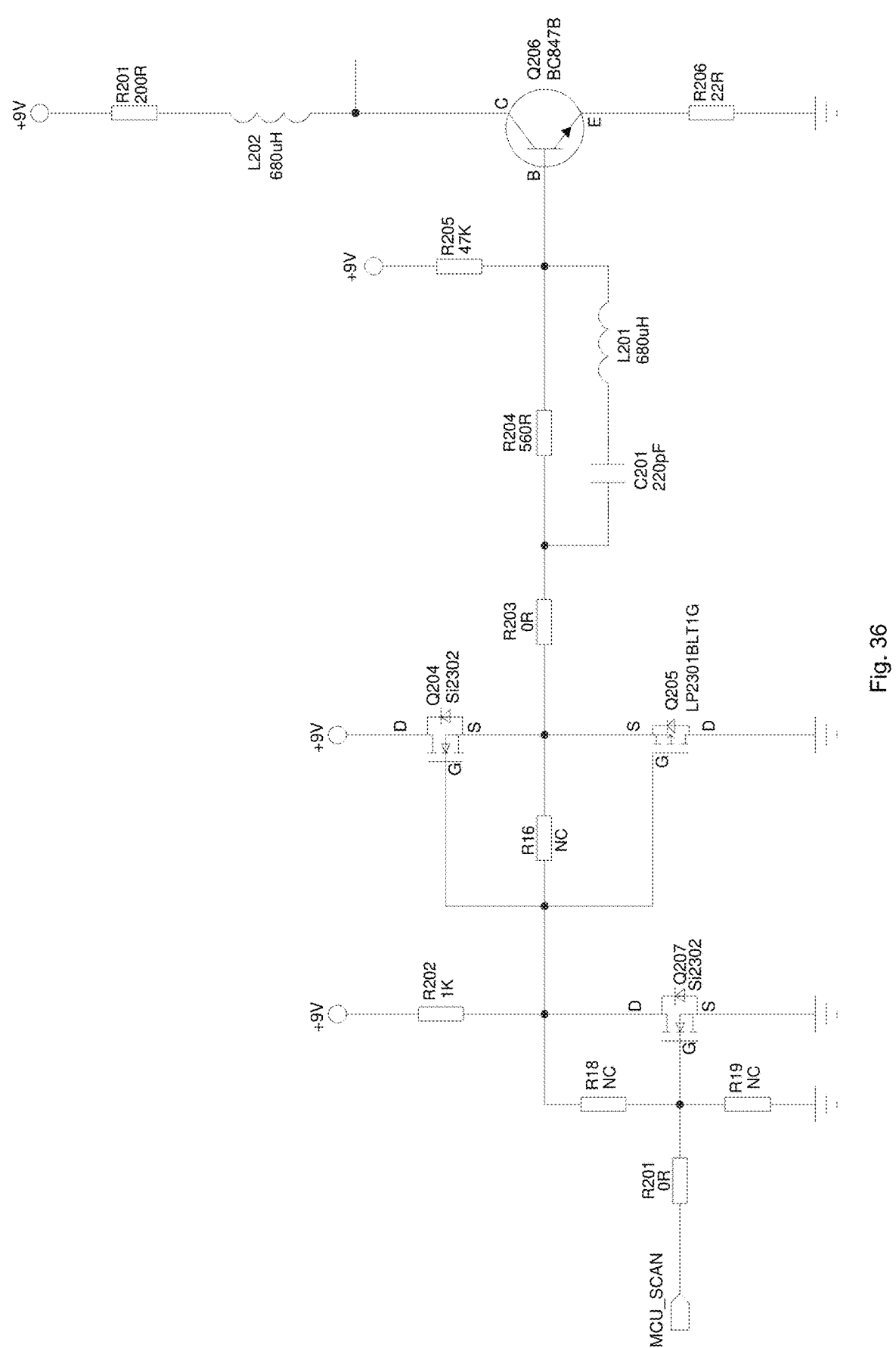
FIG. 36 is a circuit diagram of a first part of the primary unit signal processing module of the present invention when the first signal processing device is the signal processing module.
Figure 37:
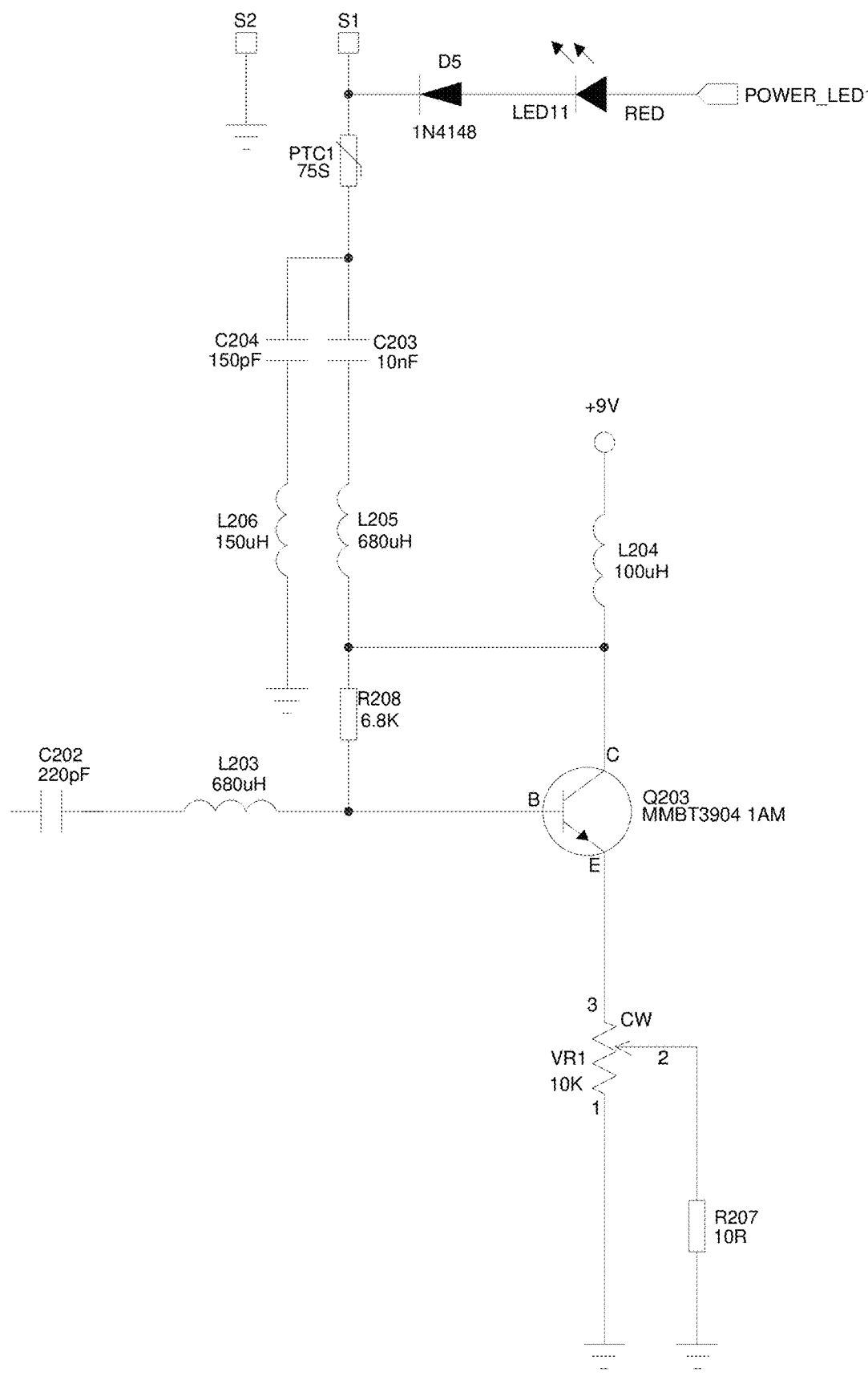
FIG. 37 is a circuit diagram of a second part of the primary unit signal processing module and the signal emitting module of the present invention when the first signal processing device is the signal processing module.
Figure 38:
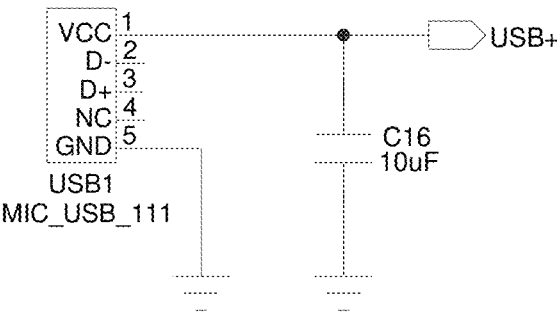
FIG. 38 is a circuit diagram of the primary unit USB interface of the present invention when the first signal processing device is the signal processing module.
Figure 39:
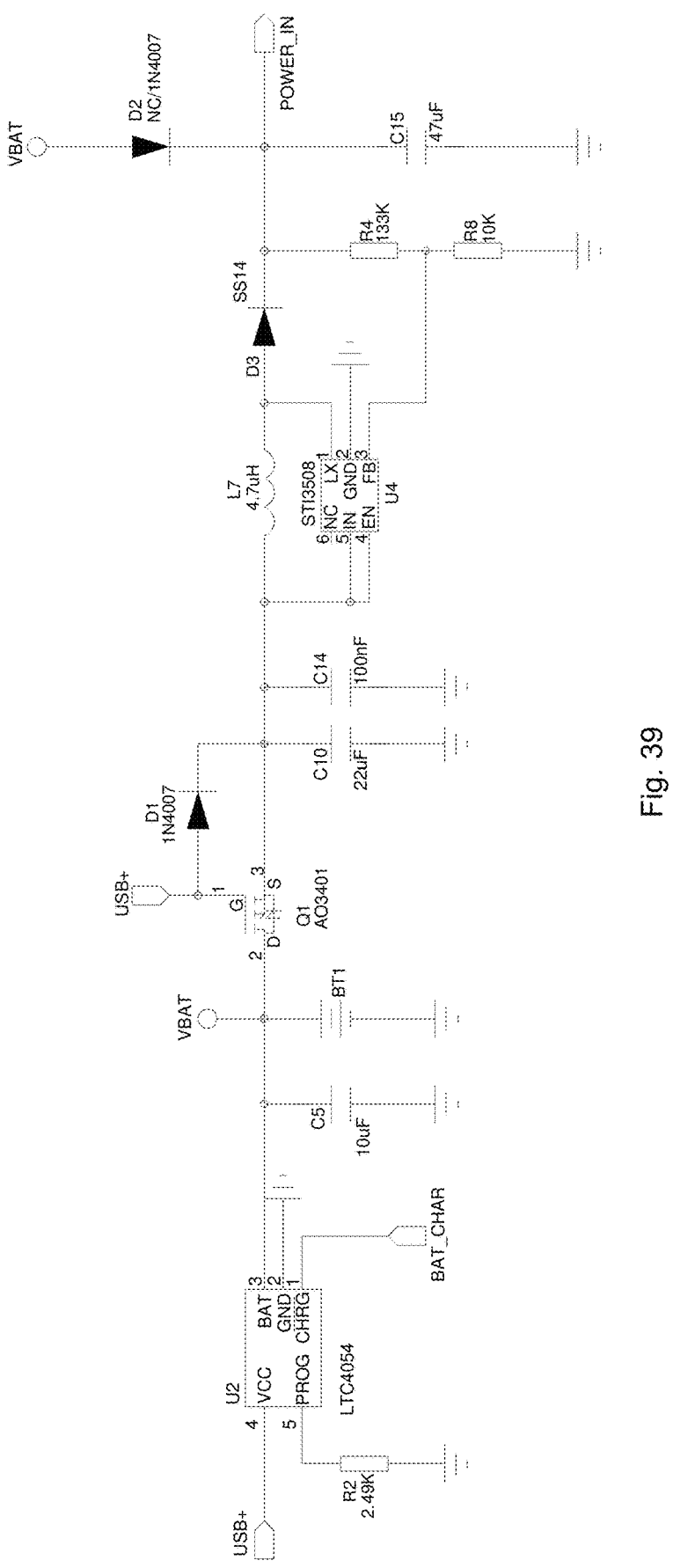
FIG. 39 is a circuit diagram of the primary unit power module of the present invention when the first signal processing device is the signal processing module.

Referring to FIGS. 36-37, when the first signal processing device is the signal processing module, the signal processing module includes an MOS transistor Q207, an MOS transistor Q204, an MOS transistor Q205, a triode Q206 and a triode Q203, a gate of the MOS transistor Q207 is a signal input port of the signal processing module, the gate of the MOS transistor Q207 is connected to a data port of the central control module via a resistor R201, a source of the MOS transistor Q207 is grounded, a drain of the MOS transistor Q207 is connected to a +9V power supply via a resistor R202, gates of the MOS transistor Q204 and the MOS transistor Q205 are connected to the drain of the MOS transistor Q207 respectively, a drain of the MOS transistor Q204 is connected to a +9V power supply, a drain of the MOS transistor Q205 is grounded, a source of the MOS transistor Q204 is connected to a source of the MOS transistor Q205, the source of the MOS transistor Q204 is connected to a base of the triode Q206 via a resistor R203 and a resistor R204 connected in series, a capacitor C201 and an inductor L201 are connected in series, the capacitor C201 and the inductor L201 connected in series are connected to a resistor R204 in parallel, a base of the triode Q206 is connected to a +9V power supply via a resistor R205, an emitter of the triode Q206 is grounded via a resistor R206, a collector of the triode Q206 is connected to a +9V power supply via a resistor R201 and an inductor L202 connected in series, the collector of the triode Q206 is connected to a base of the triode Q203 via a capacitor C202 and an inductor L203 connected in series, an emitter of the triode Q203 is grounded via a variable resistor VR1, a center tap of the variable resistor VR1 is grounded via a resistor R208, a collector of the triode Q203 is connected to a +9V power supply via an inductor L204, a base of the triode Q203 is connected to the signal emitting module via a resistor R208, an inductor L205, a capacitor C203, and a thermistor PTC1 sequentially connected in series, a common end between the resistor R208 and the inductor L205 is connected to the collector of the triode Q203, and a common end between the capacitor C203 and the thermistor PTC1 is grounded via a capacitor C204 and an inductor L206 connected in series. In the present embodiment, the signal emitting module adopts an interface for connecting an emitting probe to detect the emission of signal.

Referring to FIG. 36, the emitting circuit emits a PWM wave with a certain frequency to match the receiving circuit. Only stable signal output may be used to perform a better detection for the path and depth of the cables, which requires an LC frequency selection network of the emitted signal provides a reliable property of frequency selection, and the selected parameter may not be too large or too small. The frequency selection calculation formula: $f=1/2\pi\sqrt{L \times C}$, in which L is the inductance value of the LC frequency selection network and C is the capacitance value of the LC frequency selection network. In the present embodiment, the capacitor C201 and the inductor L201 connected in series form a first LC frequency selection network, and the capacitor C202 and the inductor L203 connected in series form a second LC frequency selection network.

Referring to FIG. 37, the variable resistor VR1 is used to regulate the strength of the emitted signal. The resistor R207 restricts a maximum current in the circuit which serves to protect the triode Q203. However, the value of the resistor R207 should not be too large, as it renders the amplitude of the emitted signal to be smaller at maximum, which results in the signal not being captured by the receiver probe, reducing the maximum distance of detecting the cable path.

Figure 13:
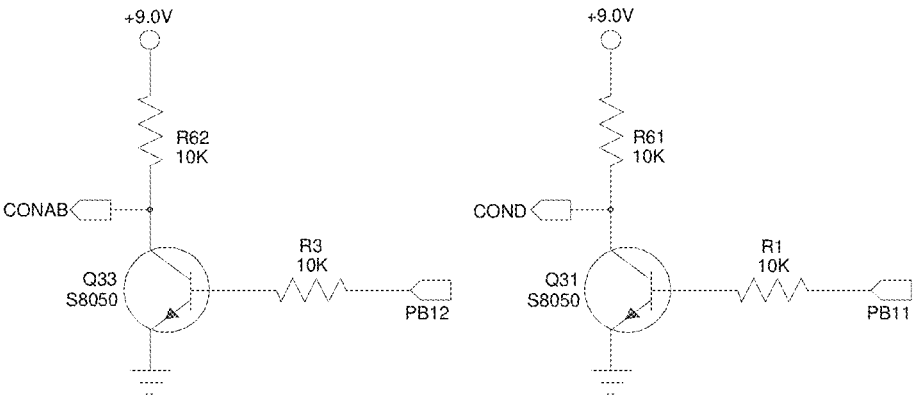
FIG. 13 is a circuit diagram of a first part of the primary unit electronic control switch of the present invention when the first signal processing device is the signal transmitting module.
Figure 14:
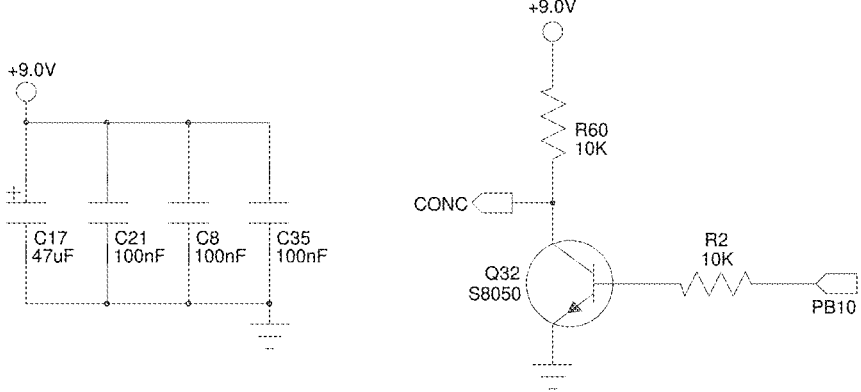
FIG. 14 is a circuit diagram of a second part of the primary unit electronic control switch of the present invention when the first signal processing device is the signal transmitting module.

In the present embodiment, referring to FIGS. 13-14, when the first signal processing device is a signal transmitting module, a data port of the central control module is connected with a primary unit electronic control switch, the primary unit electronic control switch includes a triode Q31, a triode Q32, and a triode Q33, bases of the triode Q31, the triode Q32, and the triode Q33 are connected to data ports of the primary unit central control module respectively, emitters of the triode Q31, the triode Q32, and the triode Q33 are grounded respectively, and collectors of the triode Q31, the triode Q32, and the triode Q33 are connected control ports of an electronic switch U108 respectively. The central control module controls the on and off of the channels of the electronic switch U108 by means of the triode Q31, the triode Q32 and the triode Q33, so as to achieve control of the timing of the output signals.

Figure 11:
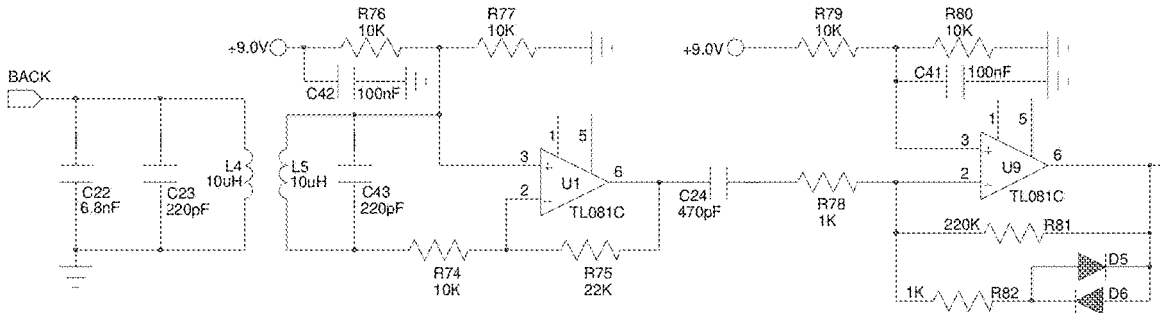
FIG. 11 is a circuit diagram of a first part of the primary unit signal feedback module of the present invention when the first signal processing device is the signal transmitting module.
Figure 12:
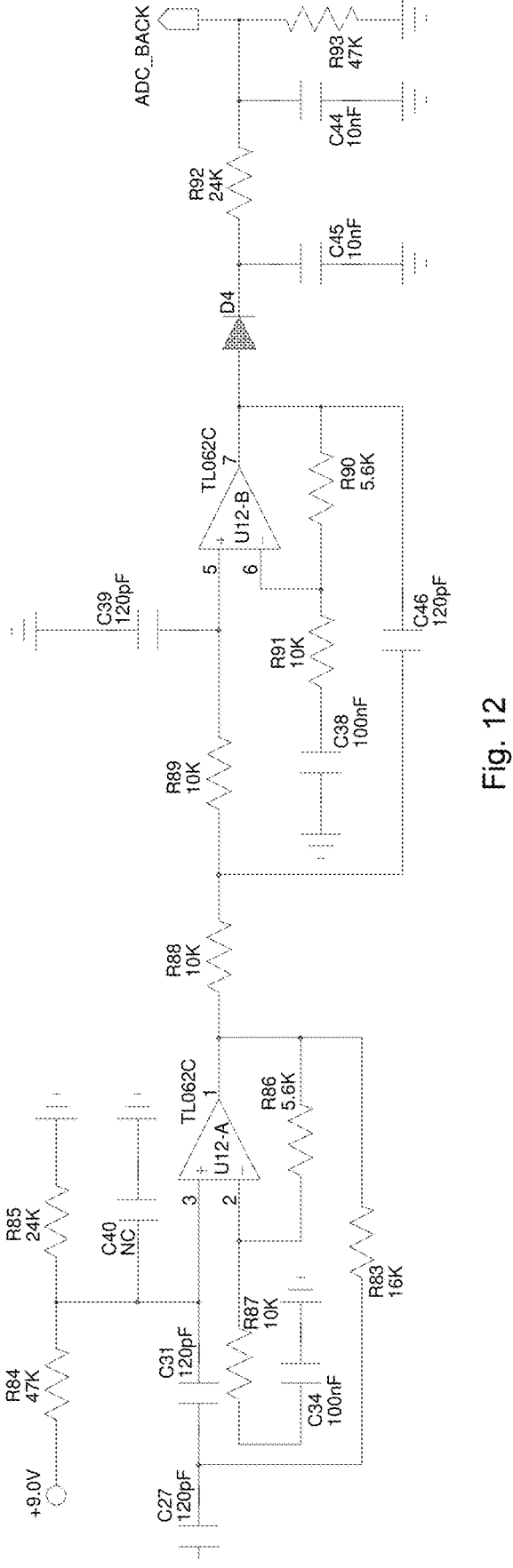
FIG. 12 is a circuit diagram of a second part of the primary unit signal feedback module of the present invention when the first signal processing device is the signal transmitting module.

In the present embodiment, referring to FIGS. 11-12, when the first signal processing device is the signal transmitting module, the primary unit part further includes a signal feedback module, the signal feedback module includes an operational amplifier U1, an operational amplifier U9, an operational amplifier U12-A, and an operational amplifier U12-B, the operational amplifier U1, operational amplifier U9, operational amplifier U12-A, and operational amplifier U12-B are connected in sequence to form a four-stage amplification system, a signal input port of the signal feedback module is connected to a primary coil of an isolation transformer TR1, and an output port of the signal feedback module is connected to a data port of the central control module.

Figure 6:
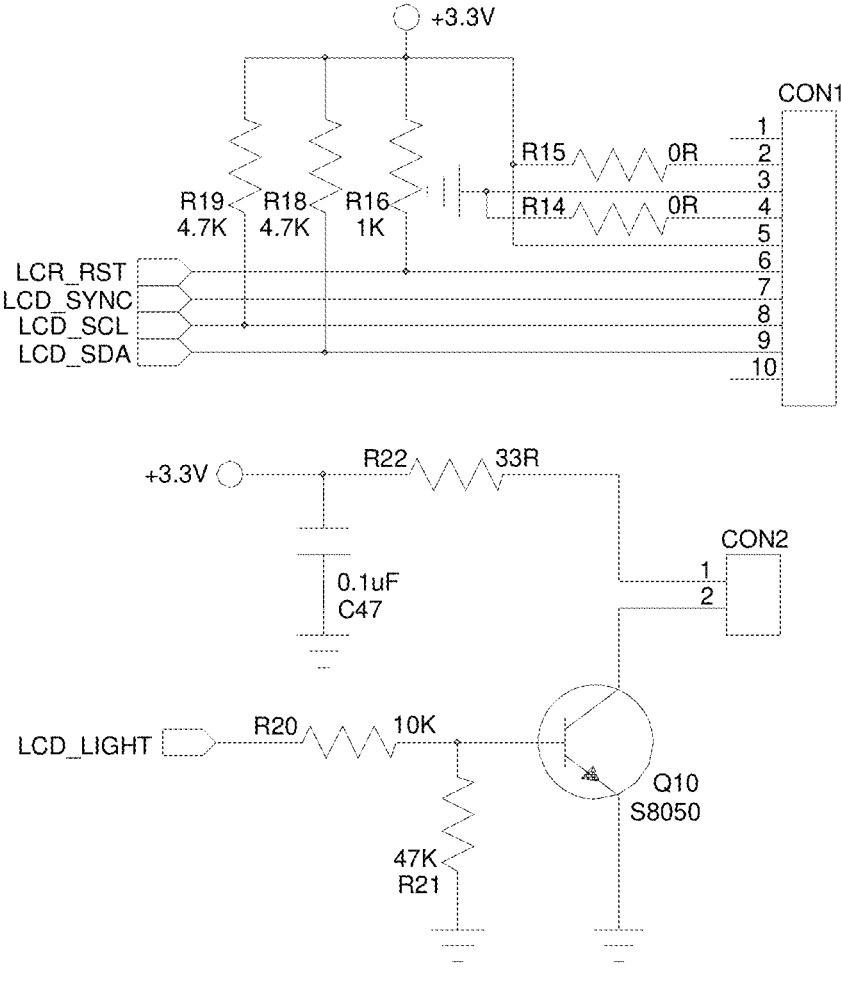
FIG. 6 is a circuit diagram of the primary unit display module of the present invention when the first signal processing device is the signal transmitting module.

In the present embodiment, referring to FIG. 6, when the first signal processing device is the signal transmitting module, the data port of the primary unit central control module is connected with a primary unit display module, and the primary unit display module adopts an LCD interface CON1 for connecting a LCD display screen to display the detection data.

In the present embodiment, referring to FIG. 6, when the first signal processing device is the signal transmitting module, a primary unit backlight module is connected to the data port of the primary unit central control module, the primary unit backlight module includes a current limiting resistor R22, an electronic control switch Q10, and a backlight interface CON2 used to connect the backlight LED, the current limiting resistor R22, the backlight interface CON2, and the electronic control switch Q10 are sequentially connected in series between a positive power supply (i.e., +3.3V) and ground, and a control port of the electronic control switch Q10 is connected to a data port of the primary unit central control module. The primary unit central control module controls the on and off of the electronic control switch Q10, so as to control the operation of the backlight. In the present embodiment, the electronic control switch Q10 may adopt such as a PNP type triode, a NPN type triode, a field-effect transistor, controllable silicon, or other components that are able to control its on and off by electronic means. In the present embodiment, a triode is taken as an example, a base of the triode is connected to the data port of the primary unit central control module via a current limiting resistor R20.

In the present embodiment, referring to FIG. 7, when the first signal processing device is the signal transmitting module, a primary unit key module is connected to the data port of the primary unit central control module, in which the primary unit key module includes a key switch S1, a key switch S2, a key switch S3, a key switch S4, a key switch S5, a key switch S6, a key switch S7, and a key switch S8, and the key switch S1, the key switch S2, the key switch S3, the key switch S4, the key switch S5, the key switch S6, the key switch S7, and the key switch S8 are connected between the data port of the primary unit central control module and ground, respectively.

Figure 5:
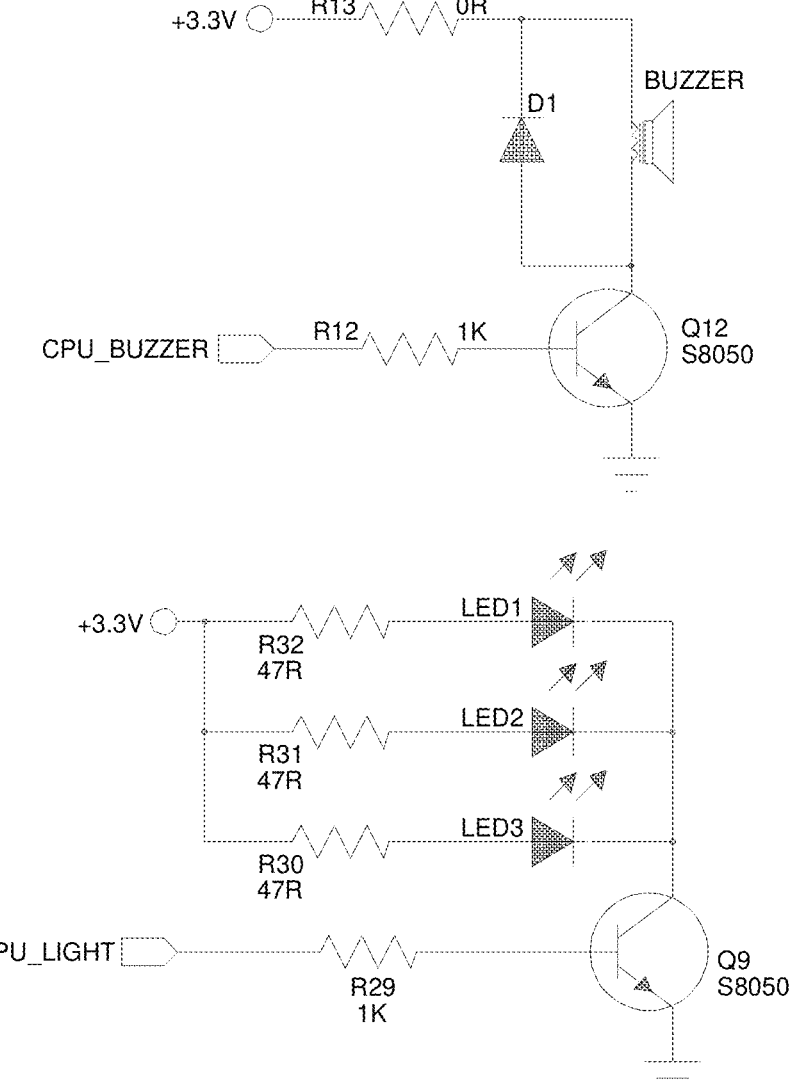
FIG. 5 is a circuit diagram of the primary unit work indicator module of the present invention when the first signal processing device is the signal transmitting module.

In the present embodiment, referring to FIG. 5, when the first signal processing device is the signal transmitting module, a buzzer module is connected to the data port of the primary unit central control module, in which the buzzer module includes a buzzer and an electronic control switch Q12, the buzzer and the electronic control switch Q12 are connected in series between the positive power supply (i.e., +3.3V) and ground, and a control port of the electronic control switch Q12 is connected to a data port of the primary unit central control module. The primary unit central control module controls the on and off of the electronic control switch Q12, so as to control the operation of the buzzer. In the present embodiment, the electronic control switch Q12 may adopt such as a PNP type triode, a NPN type triode, a field-effect transistor, controllable silicon, or other components that are able to control its on and off by electronic means. In the present embodiment, a triode is taken as an example, a base of the triode is connected to the data port of the primary unit central control module via a current limiting resistor R12.

In the present embodiment, referring to FIG. 5, when the first signal processing device is the signal transmitting module, a work indicator module is connected to the data port of the primary unit central control module, in which the work indicator module includes a current limiting resistor R30, a current limiting resistor R31, a current limiting resistor R32, an electronic control switch Q9, an indicator LED1, an indicator LED2, and an indicator LED3, the current limiting resistor R32 and the indicator LED1 are connected in series, the current limiting resistor R31 and the indicator LED2 are connected in series, the current limiting resistor R30 and the indicator LED3 are connected in series, the series-connected current limiting resistor R32 and the indicator LED1, the series-connected current limiting resistor R31 and the indicator LED2, and the series-connected current limiting resistor R30 and the indicator LED3 are connected in parallel and are connected between the positive power supply (i.e., +3.3V) and ground via the electronic control switch Q9, and a control port of the electronic control switch Q9 is connected to a data port of the primary unit central control module. The primary unit central control module controls the on and off of the electronic control switch Q9, so as to control the operation of the indicator LED1, the indicator LED2, and the indicator LED3. In the present embodiment, the electronic control switch Q9 may adopt such as a PNP type triode, a NPN type triode, a field-effect transistor, controllable silicon, or other components that are able to control its on and off by electronic means. In the present embodiment, a triode is taken as an example, a base of the triode is connected to the data port of the primary unit central control module via a current limiting resistor R29.

Figure 4:
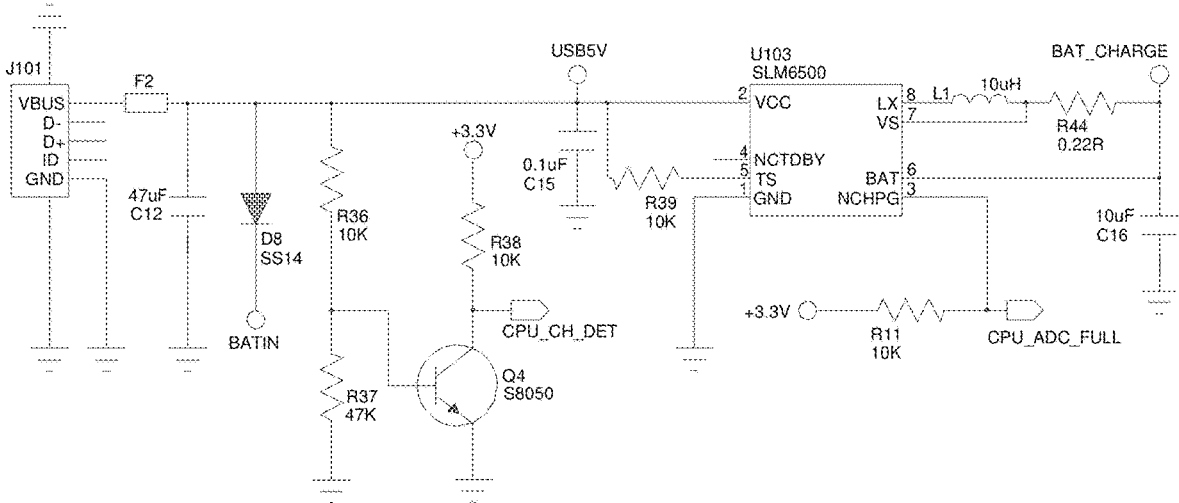
FIG. 4 is a circuit diagram of the primary unit charging module of the present invention when the first signal processing device is the signal transmitting module.

In the present embodiment, referring to FIG. 4, the primary unit power module includes a primary unit USB interface (this interface is denoted by J101 when the first signal processing device is the signal transmitting module), a primary unit charging management module (this module is denoted by U103 when the first signal processing device is the signal transmitting module), a primary unit lithium battery, and a primary unit power management device, the primary unit USB interface is connected to a power input port of the primary unit charging management module, the primary unit lithium battery is connected to a power output port of the primary unit charging management module, and the primary unit lithium battery is charged via the primary unit USB interface.

Figure 3:
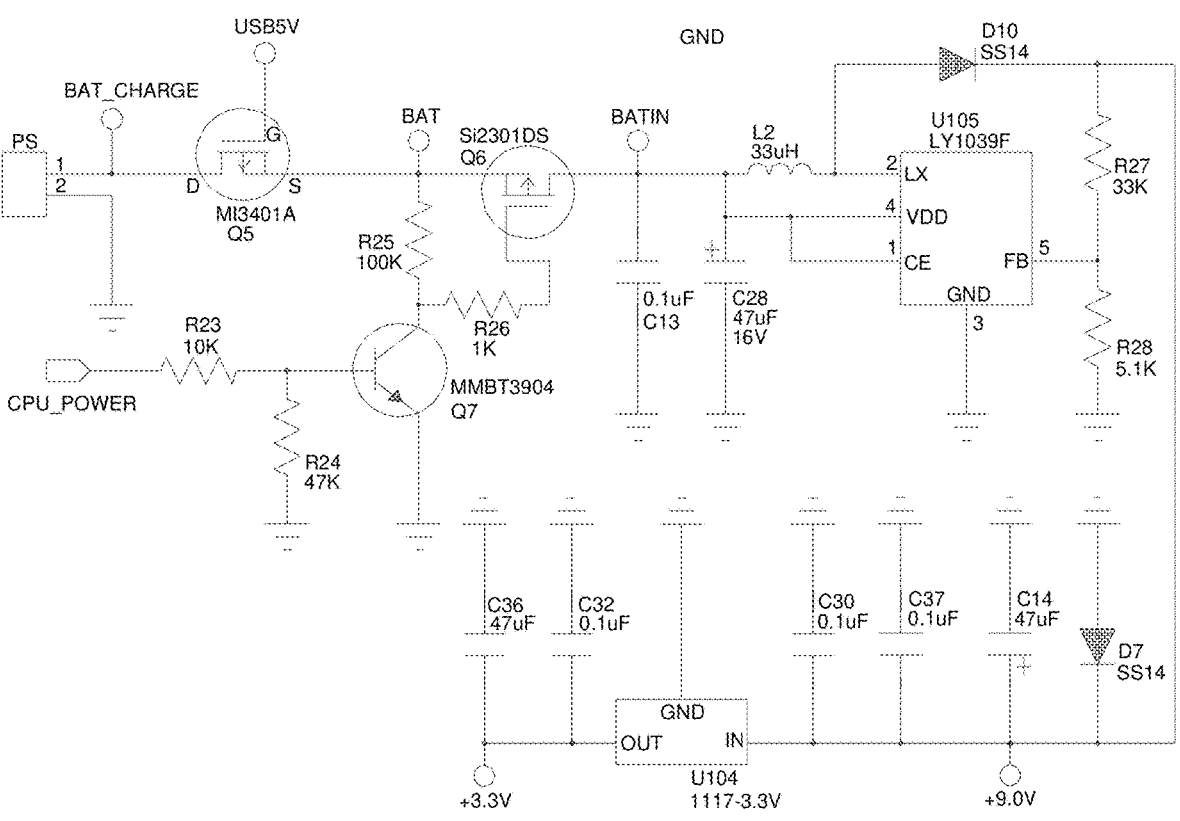
FIG. 3 is a circuit diagram of the primary unit power module of the present invention when the first signal processing device is the signal transmitting module.

Referring to FIGS. 3-4, when the first signal processing device is a signal transmitting module, the primary unit power management device includes a primary unit boost chip U105 and a primary unit voltage regulator chip U104, the primary unit USB interface J101 is connected to a power input port of the primary unit charging management module U103, the primary unit lithium battery is connected to a power output port of the primary unit charging management module U103, the primary unit lithium battery is charged via the primary unit USB interface J101, a power input port of the primary unit boost chip U105 is connected to the primary unit lithium battery, a voltage of the primary unit lithium battery is converted to +9.0V for power supply via the primary unit boost chip U105, and +9.0V voltage is regulated to +3.3V via the primary unit voltage regulator chip U104 and then output to the primary unit for power supply.

Figure 42:
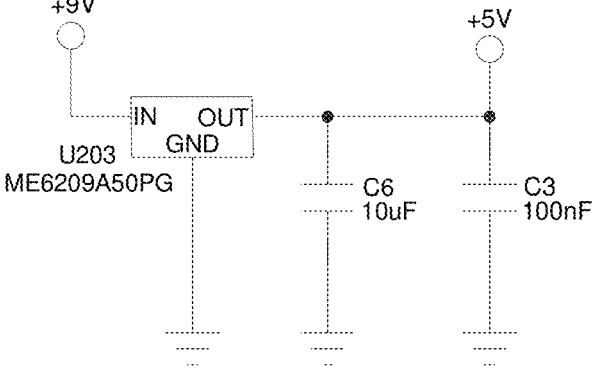
FIG. 42 is a circuit diagram of the primary unit voltage regulator module of the present invention when the first signal processing device is the signal processing module.
Figure 42:
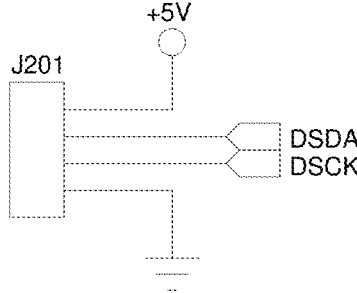

Referring to FIG. 42, when the first signal processing device is the signal processing module, the primary unit power management device includes a primary unit power management module and a voltage regulator module, the primary unit USB interface is connected to a power input port of the primary unit charging management module, the primary unit lithium battery is connected to a power output port of the primary unit charging management module, the primary unit USB interface is used to input power, the input power charges the primary unit lithium battery via the primary unit charging management module, a power input port of a primary unit power management module is connected to the primary unit lithium battery, the output power of the primary unit lithium battery is converted to +9V for supplying power by the primary unit power management module. In the present embodiment, the voltage regulator module adopts a voltage regulator chip U203 of model ME6209A50PG, which converts the power from +9V to +5V to supply power for the central control module.

Figure 41:
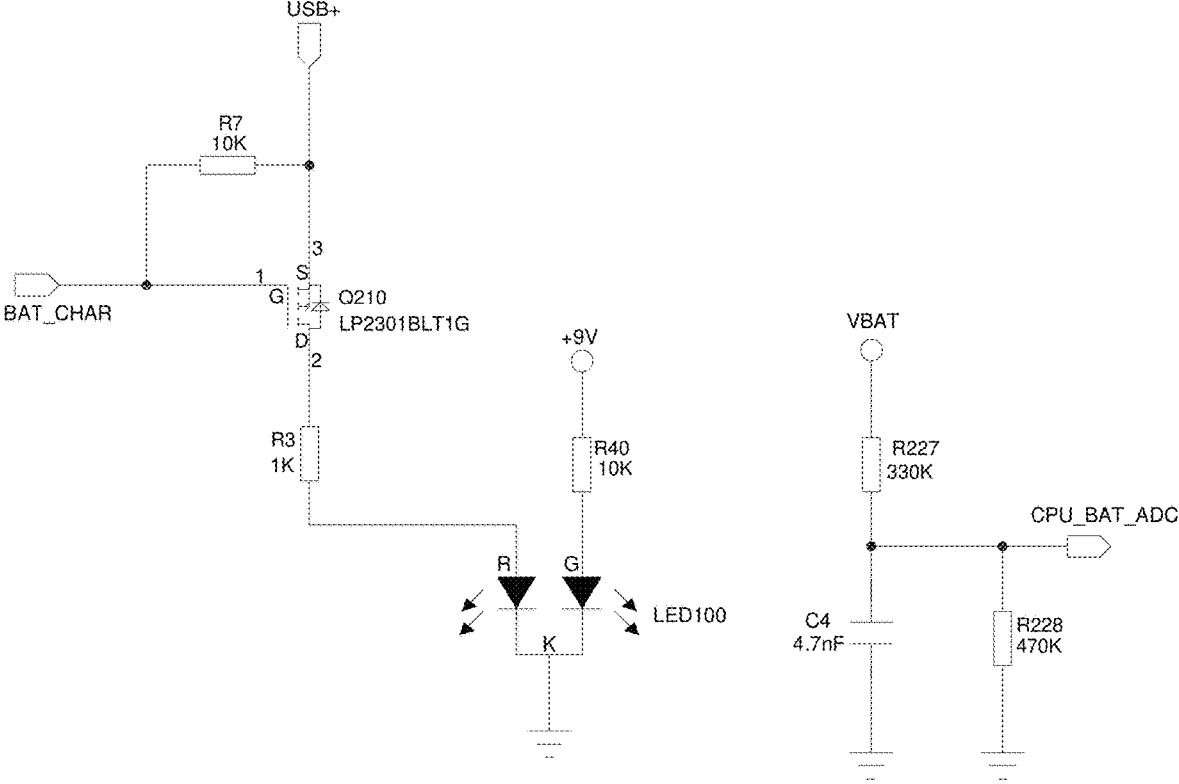
FIG. 41 is a circuit diagram of the primary unit power-on indicator module and the voltage detection module of the present invention when the first signal processing device is the signal processing module.

In the present embodiment, referring to FIGS. 7 and 41 a positive electrode of the primary unit lithium battery is connected with a primary unit battery voltage detection module for detecting the voltage of the lithium battery, the primary unit battery voltage detection module includes two resistors connected in series, and a common end between two resistors is connected to a data port of the primary unit central control module; and when the first signal processing device is the signal transmitting module, a positive electrode of the secondary unit lithium battery is connected with a secondary unit battery voltage detection module, the secondary unit battery voltage detection module includes two resistors connected in series, and a common end between two resistors is connected to a data port of the secondary unit central control module. Specifically, when the first signal processing device is the signal transmitting module, the primary unit battery voltage detection module includes a resistor R33 and a resistor R34 connected in series, a common end between the resistor R33 and the resistor R34 is connected to a data port of the primary unit central control module; and when the first signal processing device is the signal processing module, the primary unit battery voltage detection module includes a resistor R227 and a resistor R228, the resistor R227 and the resistor R228 are connected in series between the positive electrode of the primary unit lithium battery and ground, a common end between the resistor R227 and the resistor R228 is connected to a data port of the primary unit central control module, and this data port has an ADC function.

Figures 27, 28:
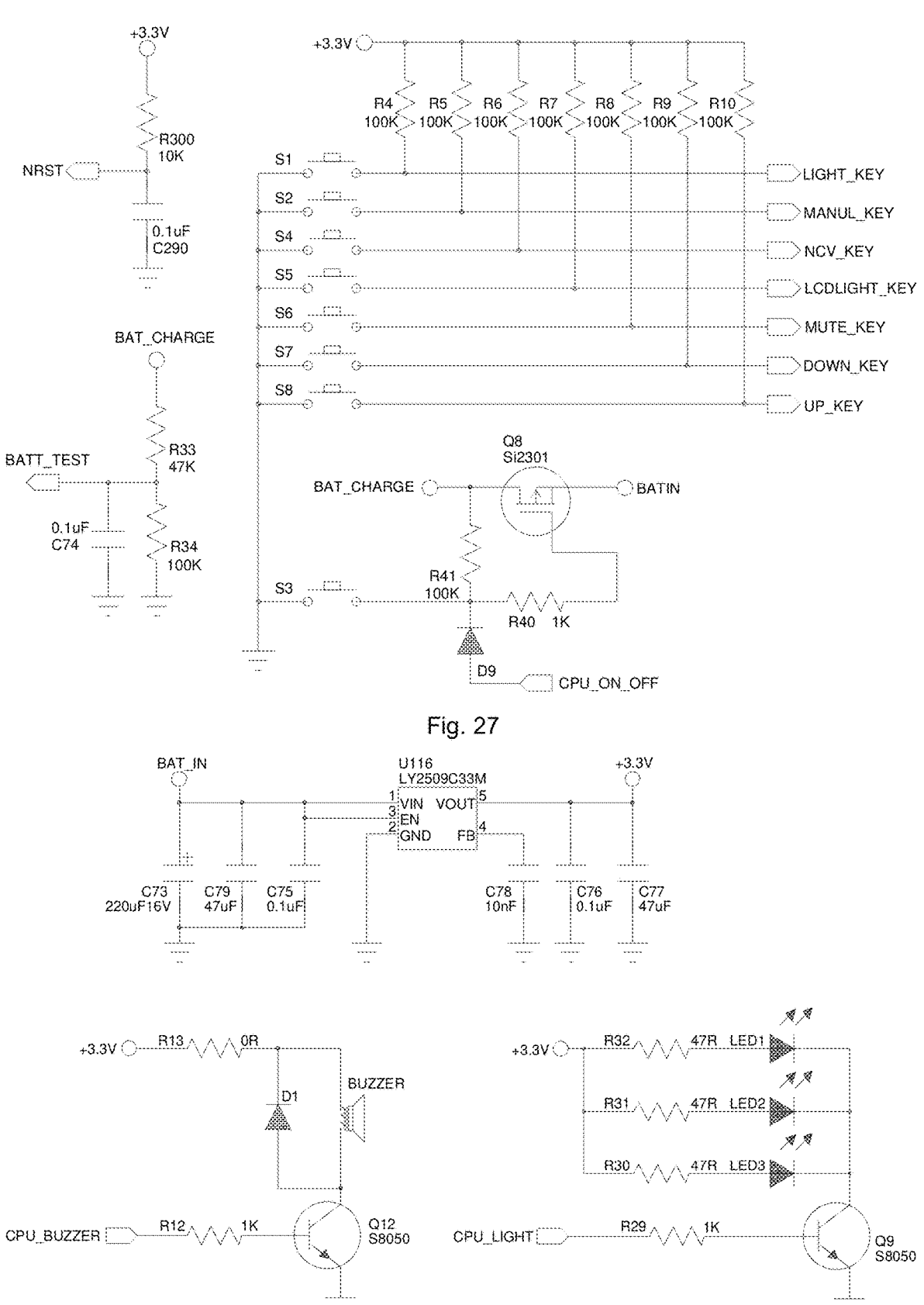
FIG. 27 is a circuit diagram of the secondary unit key module of the present invention when the first signal processing device is the signal transmitting module.
FIG. 28 is a circuit diagram of the secondary unit work indicator module of the present invention when the first signal processing device is the signal transmitting module.

In the present embodiment, referring to FIGS. 27, when the first signal processing device is the signal transmitting module, the secondary unit central control module adopts an MCU chip of model STM32F030C8T6. For specific implementation, other types of chips may also be used instead. A crystal oscillator module is connected between an OSC_IN interface and an OSC_OUT interface of the secondary unit central control module, in which the crystal oscillator module adopts a quartz crystal oscillator of 8 MHz, and the crystal oscillator module is specifically selected according to the secondary unit central control module. A power-on reset module is connected to an NRST interface of the secondary unit central control module, and the power-on reset module includes capacitor C290 and resistor R300, capacitor C290 is connected between ground and the NRST interface of the central control module, and resistor R300 is connected between the NRST interface of the central control module and a positive power supply (i.e., +3.3V).

Since the emitted signal has positive and negative polarities, the electromagnetic field generated by the conductor connected to the emitting probe also has directions. The receiving circuit of the present disclosure processes the received signals from three stereoscopic directions: X-axis, Y-axis and Z-axis, which fully improves the efficiency and reliability of the testing. Due to the high specificity of the emitted signal, the microcontroller digital signal processing circuit determines and distinguishes the signal received by the receiving circuit. Only when receiving a timing signal as same as the emitted signal, the receiving circuit performs a feedback, which greatly improves the accuracy of the inspection and eliminates false tests. In the present embodiment, the receiving circuits of X-axis, Y-axis and Z-axis are the same, and the X-axis is taken as an example to be described in detail as follow.

Figure 15:
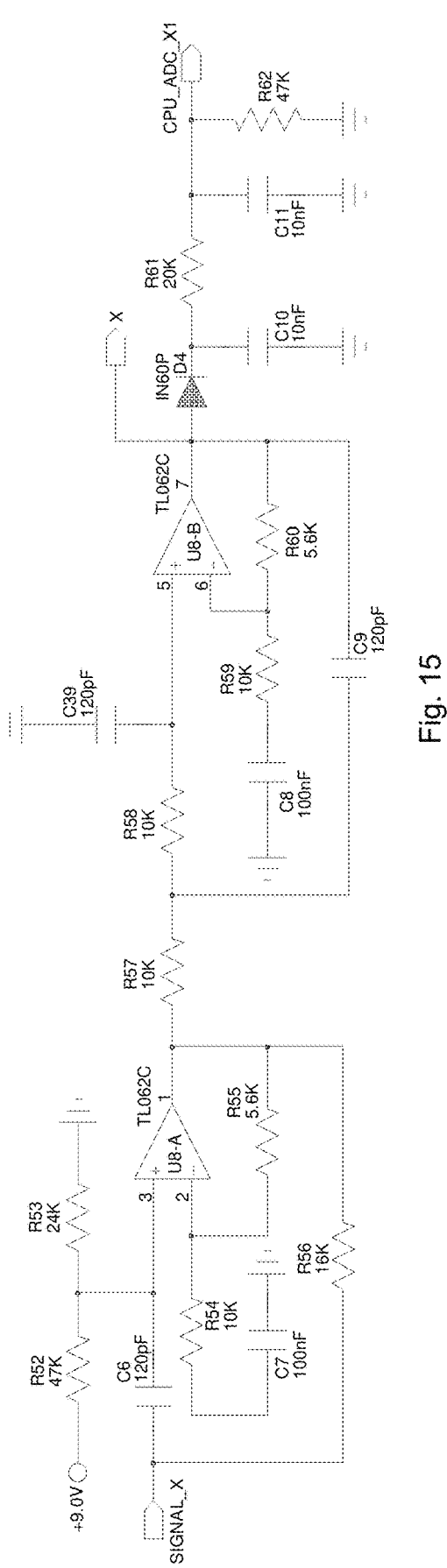
FIG. 15 is a circuit diagram of the secondary unit X-axis secondary amplifying module of the present invention when the first signal processing device is the signal transmitting module.
Figure 16:
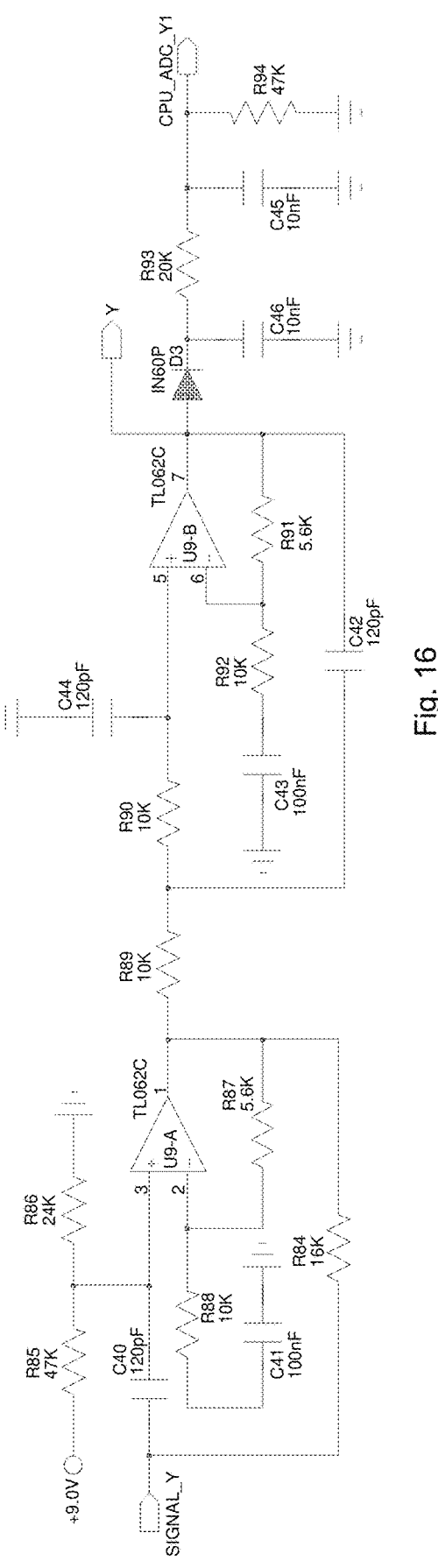
FIG. 16 is a circuit diagram of the secondary unit Y-axis secondary amplifying module of the present invention when the first signal processing device is the signal transmitting module.
Figure 17:
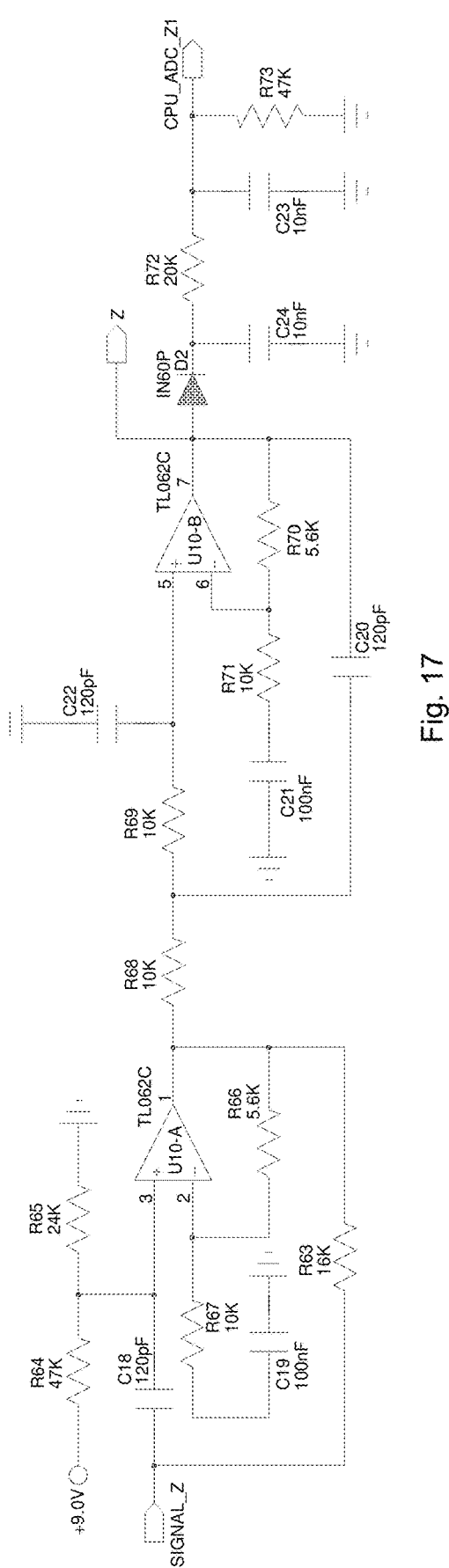
FIG. 17 is a circuit diagram of the secondary unit Z-axis secondary amplifying module of the present invention when the first signal processing device is the signal transmitting module.
Figure 18:
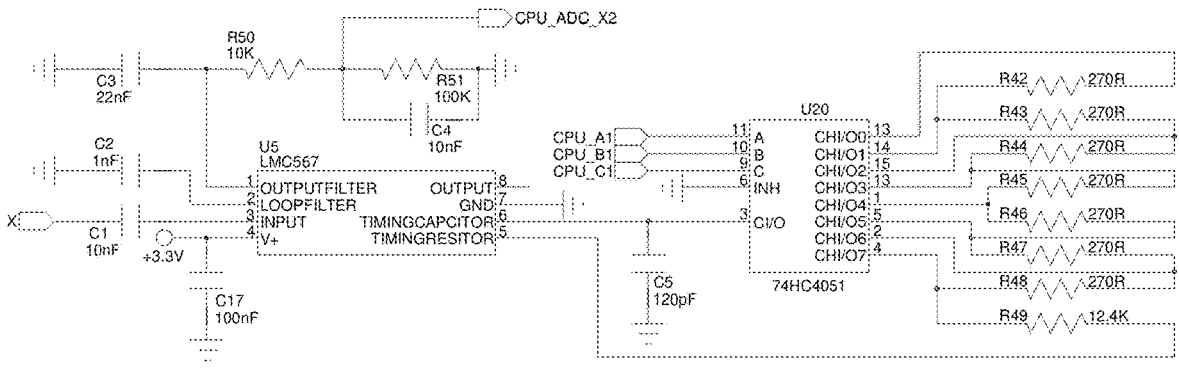
FIG. 18 is a circuit diagram of the secondary unit X-axis phase-locked loop module of the present invention when the first signal processing device is the signal transmitting module.
Figure 19:
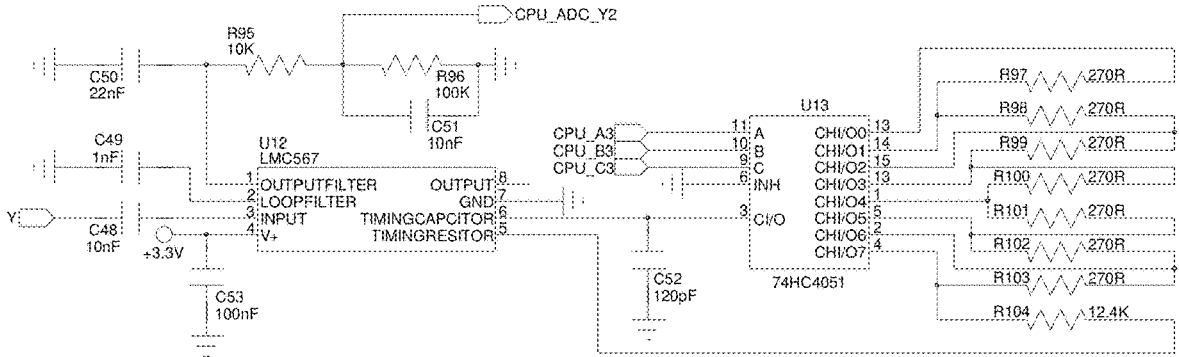
FIG. 19 is a circuit diagram of the secondary unit Y-axis phase-locked loop module of the present invention when the first signal processing device is the signal transmitting module.
Figure 20:
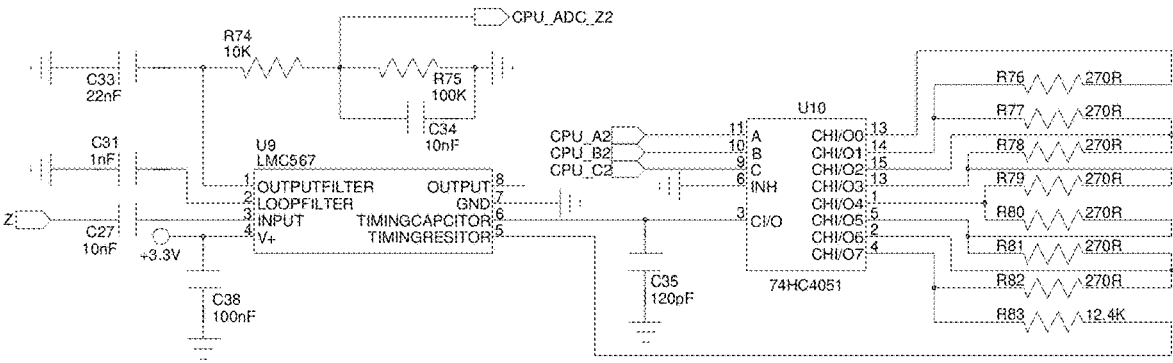
FIG. 20 is a circuit diagram of the secondary unit Z-axis phase-locked loop module of the present invention when the first signal processing device is the signal transmitting module.
Figure 30:
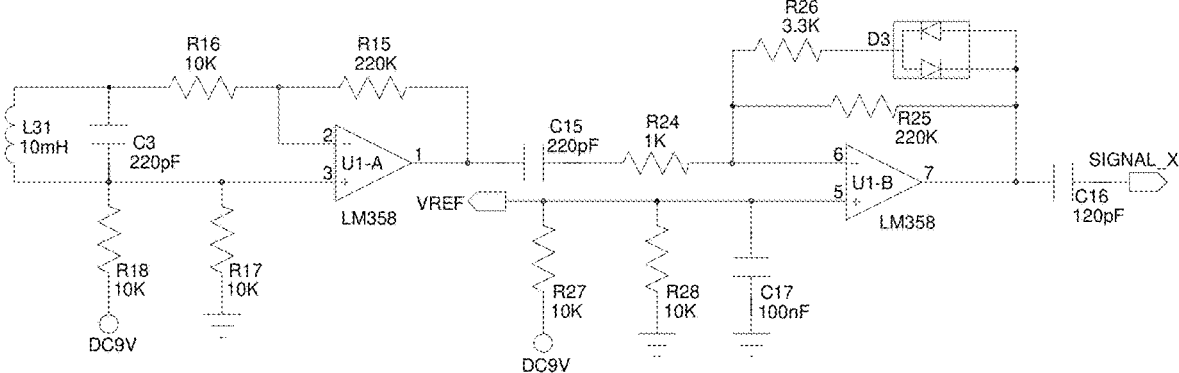
FIG. 30 is a circuit diagram of the secondary unit X-axis primary amplifying module of the present invention when the first signal processing device is the signal transmitting module.
Figure 31:
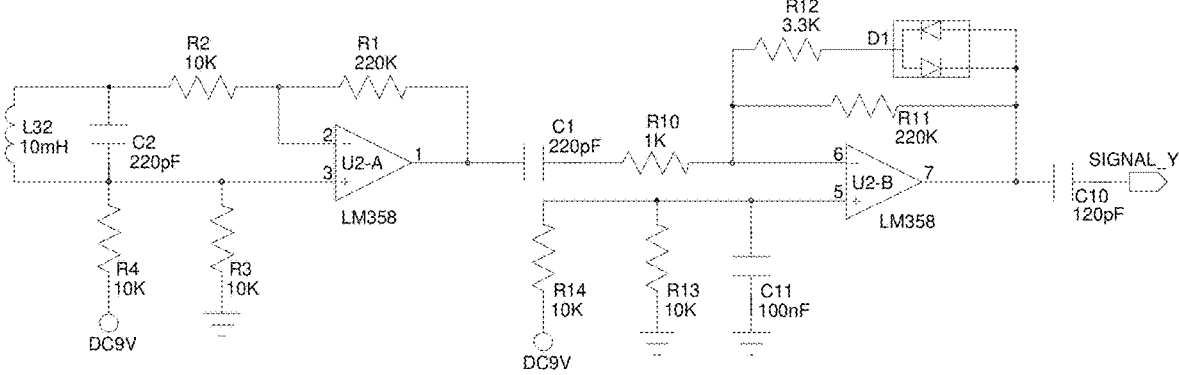
FIG. 31 is a circuit diagram of the secondary unit Y-axis primary amplifying module of the present invention when the first signal processing device is the signal transmitting module.
Figure 32:
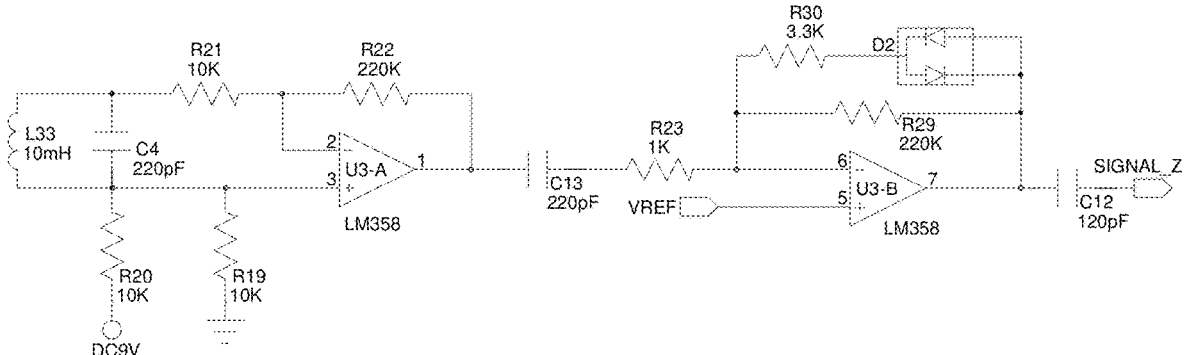
FIG. 32 is a circuit diagram of the secondary unit Z-axis primary amplifying module of the present invention when the first signal processing device is the signal transmitting module.

Referring to FIGS. 15, 18, and 30, the receiving coil L31 is connected to an input port of the X-axis primary amplifying module, the X-axis primary amplifying module includes an operational amplifier U1-A and an operational amplifier U1-B, the operational amplifier U1-A and the operational amplifier U1-B are connected to form a two-stage amplification circuit to perform a primary amplification of the signal received by the receiving coil L31, the X-axis primary amplifying module is connected to the X-axis secondary amplifying module via an interface J1, the X-axis secondary amplifying module includes an operational amplifier U8-A and an operational amplifier U8-B, the operational amplifier U8-A and the operational amplifier U8-B are connected to form a two-stage amplification circuit to perform a further amplification of the signal received by the receiving coil L31, one branch of an output port of the X-axis secondary amplifying module is connected to a data port of the secondary unit central control module, another branch of the output port of the X-axis secondary amplifying module is connected to an input port of the X-axis phase-locked loop module, an output port of the X-axis phase-locked loop module is connected to a data port of the secondary unit central control module, a clock signal port of the X-axis phase-locked loop module is connected to a channel selector U20, and a control port of the channel selector U20 is connected to a data port of the secondary unit central control module.

Figure 21:
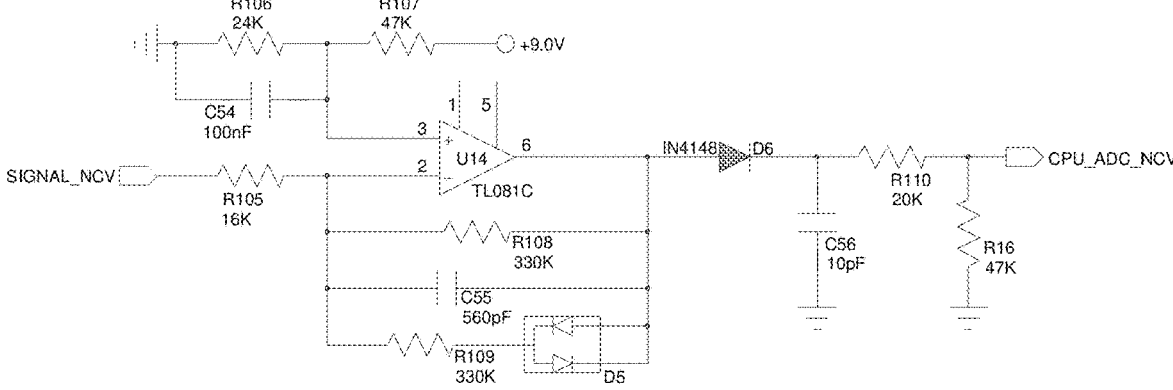
FIG. 21 is a circuit diagram of the secondary unit wireless voltage signal amplifying module of the present invention when the first signal processing device is the signal transmitting module.
Figure 33:
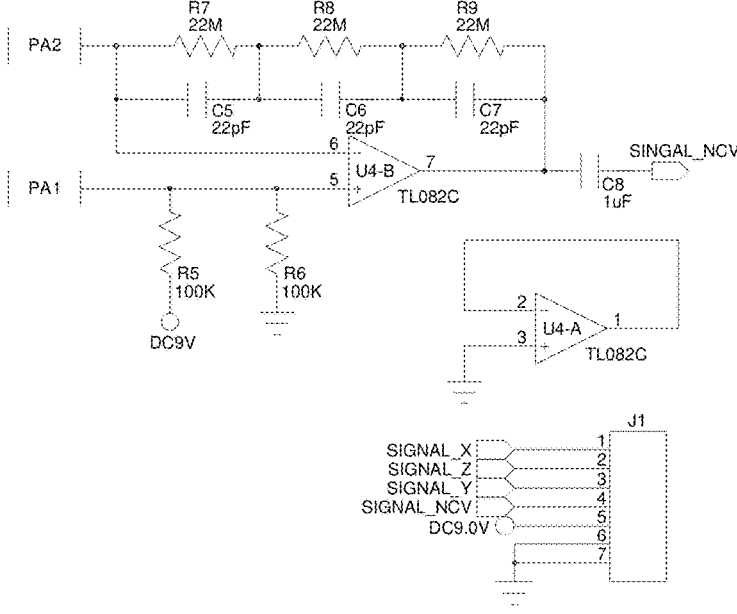
FIG. 33 is a circuit diagram of the secondary unit wireless voltage signal receiving module of the present invention when the first signal processing device is the signal transmitting module.
Figure 34:
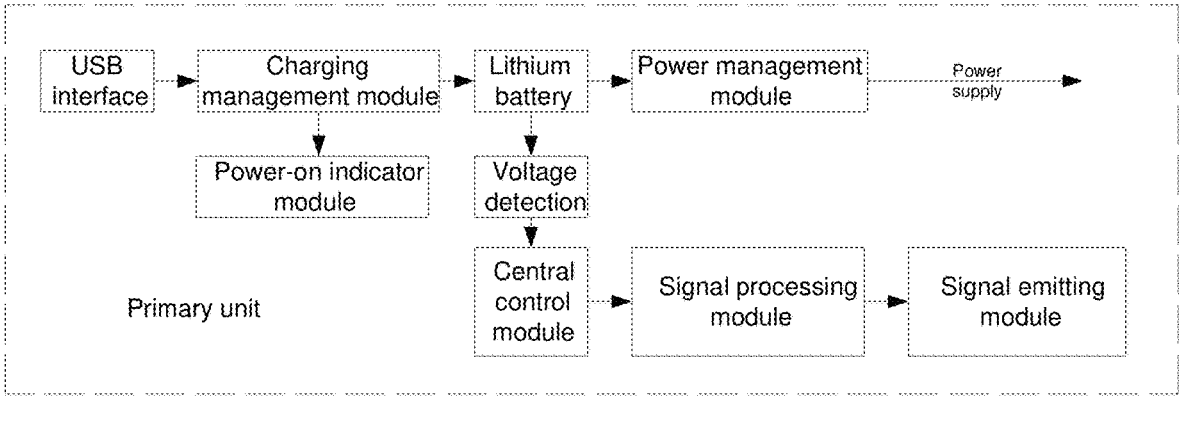
FIG. 34 is a circuit block diagram of the present invention when the first signal processing device is the signal processing module.
Figure 34:
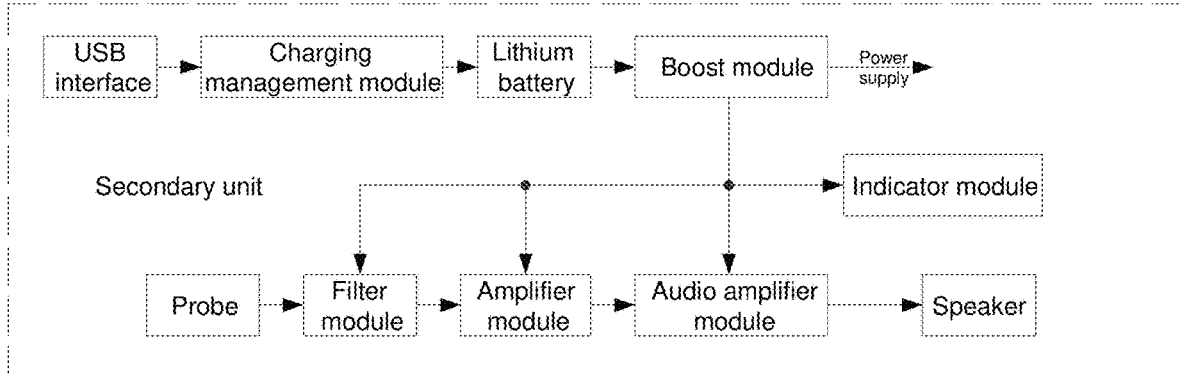

In the present embodiment, referring to FIGS. 21 and 33, when the first signal processing device is the signal transmitting module, the secondary unit further includes a wireless voltage detection module, the wireless voltage detection module includes an NCV coil, an operational amplifier U4-B, and an operational amplifier U14, the NCV coil is connected to an input port of the operational amplifier U4-B, an output of the operational amplifier U4-B is connected to an input port of the operational amplifier U14, and an output port of the operational amplifier U14 is connected to a data port of the secondary unit central control module, so as to perform a non-contact voltage detection.

Figure 22:
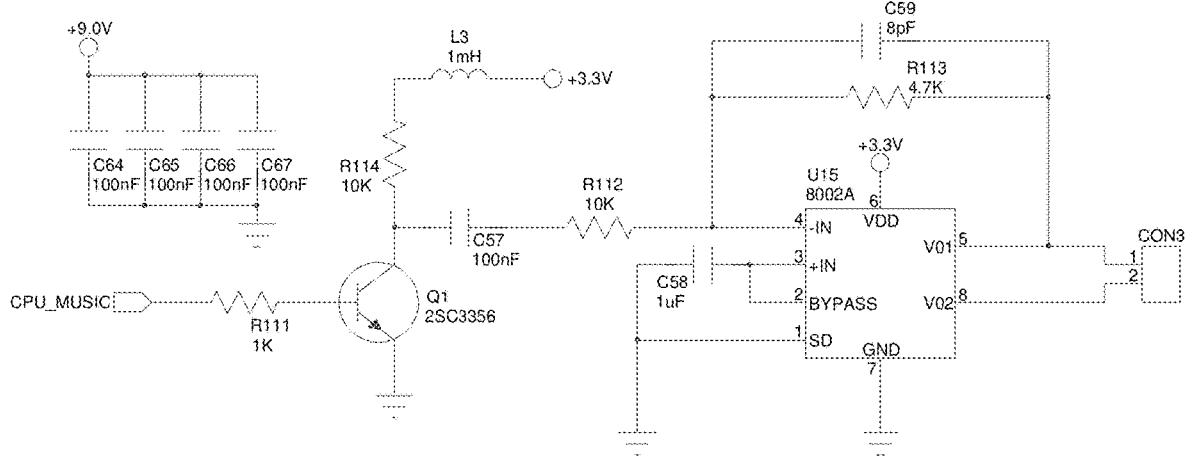
FIG. 22 is a circuit diagram of the secondary unit audio amplifier module of the present invention when the first signal processing device is the signal transmitting module.
Figure 23:
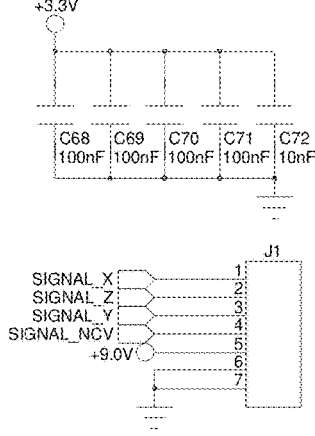
FIG. 23 is a circuit diagram of the secondary unit signal receiving connection interface module of the present invention when the first signal processing device is the signal transmitting module.
Figure 24:
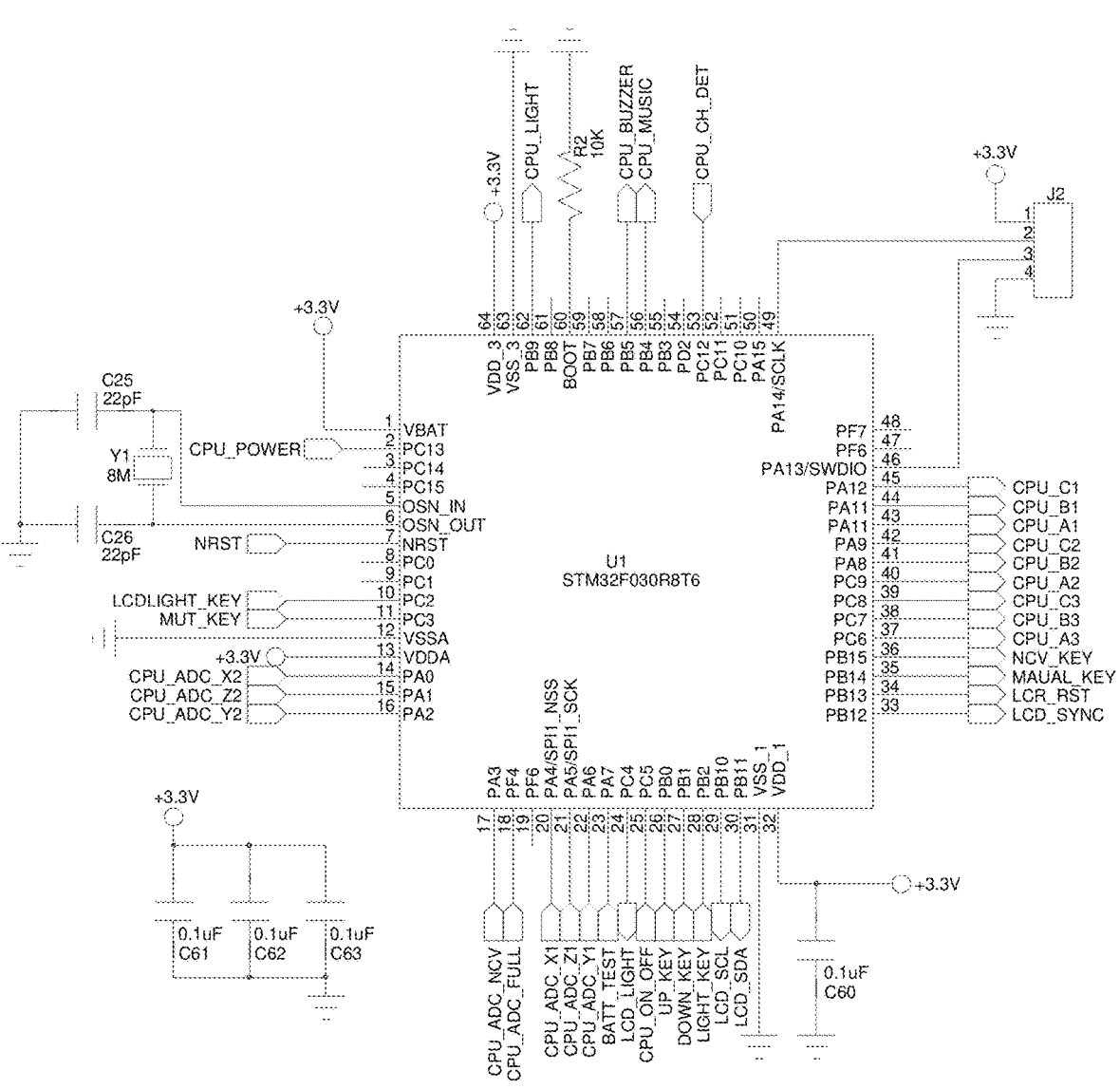
FIG. 24 is a circuit diagram of the secondary unit central control module of the present invention when the first signal processing device is the signal transmitting module.
Figure 44:
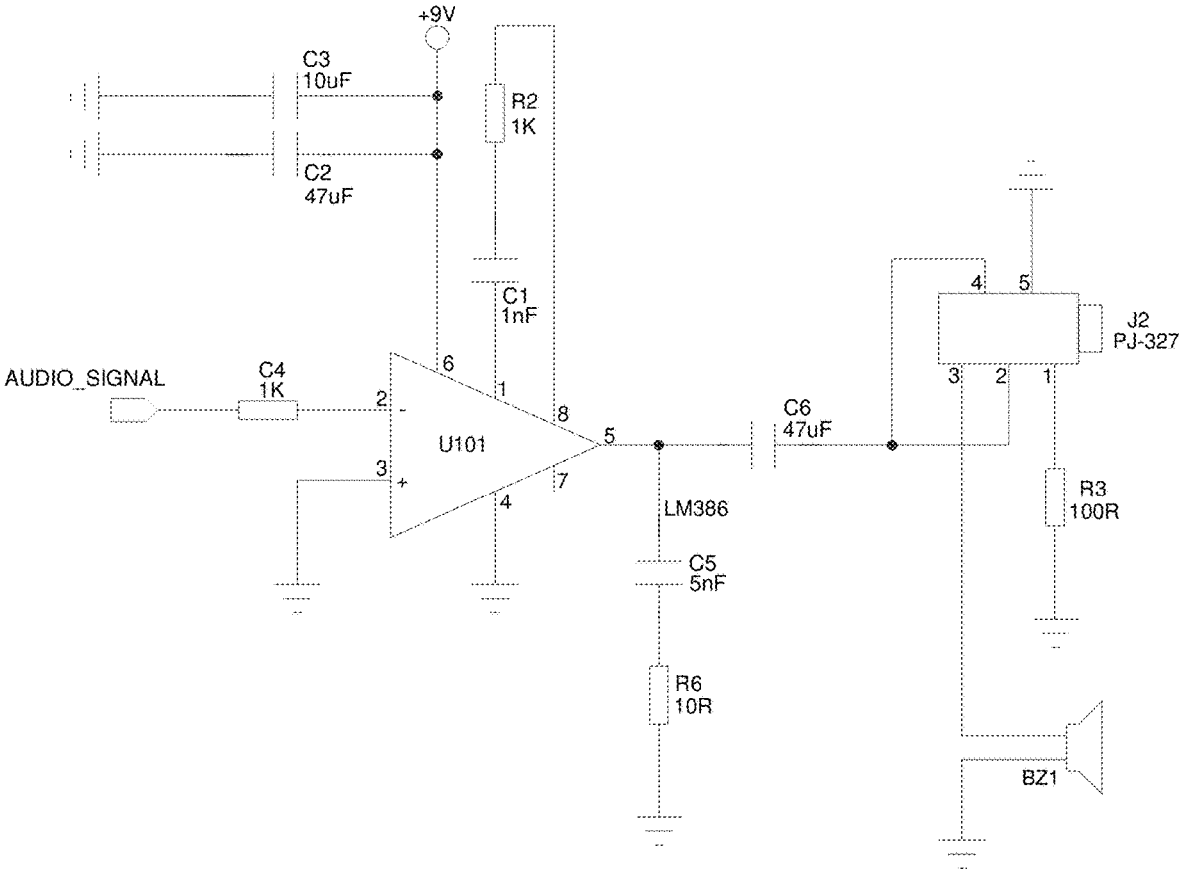
FIG. 44 is a circuit diagram of the secondary unit audio amplifier module of the present invention when the first signal processing device is the signal processing module.

In the present embodiment, referring to FIG. 22, when the first signal processing device is the signal transmitting module, a data port of the secondary unit central control module is connected with an audio amplifier chip U15, and an output port of the audio amplifier chip U15 is connected with a speaker; and referring to FIG. 44, when the first signal processing device is the signal processing module, the alarm module includes an audio power amplifier U101 and a speaker BZ1, an output port of the amplifier module is connected to a signal input port of the audio power amplifier U101, and an output port of the audio power amplifier U101 is connected to the speaker BZ1.

Figure 29:
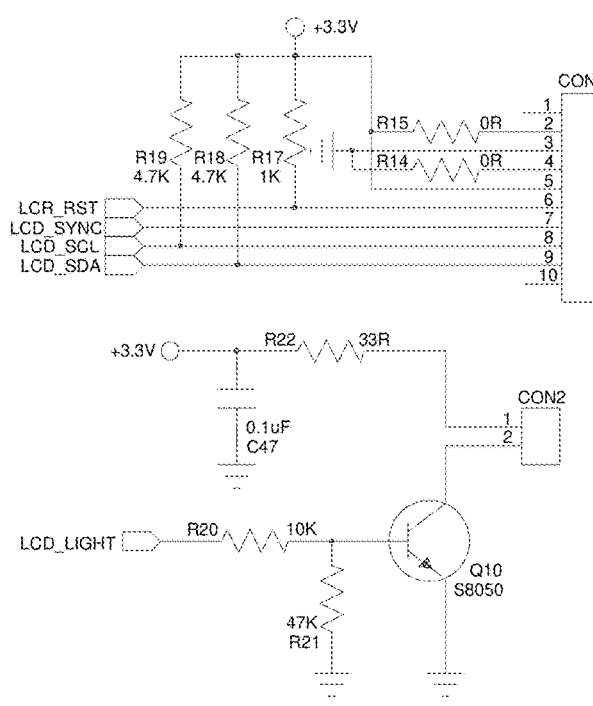
FIG. 29 is a circuit diagram of the secondary unit display module of the present invention when the first signal processing device is the signal transmitting module.

In the present embodiment, referring to FIG. 29, a secondary unit display module is connected to the data port of the secondary unit central control module, in which the electronic components contained in the secondary unit display module and the connection relationship between them are the same as those contained in the primary unit display module and the connection relationship between them. That is, the secondary unit display module also adopts the LCD interface CON1 for connecting the LCD display screen to display the detection data.

In the present embodiment, referring to FIG. 29, a secondary unit backlight module is connected to the data port of the secondary unit central control module, in which the electronic components contained in the secondary unit backlight module and the connection relationship between them are the same as those contained in the primary unit backlight module and the connection relationship between them. That is, the secondary unit backlight module also includes a current limiting resistor R22, an electronic control switch Q10, and a backlight interface CON2 used to connect the backlight LED, the current limiting resistor R22, the backlight interface CON2, and the electronic control switch Q10 are sequentially connected in series between a positive power supply (i.e., +3.3V) and ground, and a control port of the electronic control switch Q10 is connected to a data port of the secondary unit central control module. The secondary unit central control module controls the on and off of the electronic control switch Q10, so as to control the operation of the backlight. In the present embodiment, the electronic control switch Q10 may adopt such as a PNP type triode, a NPN type triode, a field-effect transistor, controllable silicon, or other components that are able to control its on and off by electronic means. In the present embodiment, a triode is taken as an example, a base of the triode is connected to the data port of the central control module via a current limiting resistor R20.

In the present embodiment, referring to FIG. 27, the data port of the secondary unit central control module is connected with a secondary unit key module, in which the electronic components contained in the secondary unit key module and the connection relationship between them are the same as those contained in the primary unit key module and the connection relationship between them. The secondary unit key module includes a key switch S1, a key switch S2, a key switch S3, a key switch S4, a key switch S5, a key switch S6, a key switch S7, and a key switch S8, and the key switch S1, the key switch S2, the key switch S3, the key switch S4, the key switch S5, the key switch S6, the key switch S7, and the key switch S8 are connected between the data port of the secondary unit central control module and ground, respectively.

In the present embodiment, referring to FIG. 28, the data port of the secondary unit central control module is connected with a secondary unit buzzer module, in which the electronic components contained in the secondary unit buzzer module and the connection relationship between them are the same as those contained in the primary unit buzzer module and the connection relationship between them. That is, the secondary unit buzzer module also includes a buzzer and an electronic control switch Q12, the buzzer and the electronic control switch Q12 are connected in series between the positive power supply (i.e., 3.3V) and ground, and a control port of the electronic control switch Q12 is connected to a data port of the secondary unit central control module. The secondary unit central control module controls the on and off of the electronic control switch Q12, so as to control the operation of the buzzer. In the present embodiment, the electronic control switch Q12 may adopt such as a PNP type triode, a NPN type triode, a field-effect transistor, controllable silicon, or other components that are able to control its on and off by electronic means. In the present embodiment, a triode is taken as an example, a base of the triode is connected to the data port of the secondary unit central control module via a current limiting resistor R12.

In the present embodiment, referring to FIG. 28, the data port of the secondary unit central control module is connected with a secondary unit work indicator module, in which the electronic components contained in the secondary unit work indicator module and the connection relationship between them are the same as those contained in the primary unit work indicator module and the connection relationship between them. The secondary unit work indicator module also includes a current limiting resistor R30, a current limiting resistor R31, a current limiting resistor R32, an electronic control switch Q9, an indicator LED1, an indicator LED2, and an indicator LED3, the current limiting resistor R32 and the indicator LED1 are connected in series, the current limiting resistor R31 and the indicator LED2 are connected in series, the current limiting resistor R30 and the indicator LED3 are connected in series, the series-connected current limiting resistor R32 and the indicator LED1, the series-connected current limiting resistor R31 and the indicator LED2, and the series-connected current limiting resistor R30 and the indicator LED3 are connected in parallel and are connected between the positive power supply (i.e., +3.3V) and ground via the electronic control switch Q9, and a control port of the electronic control switch Q9 is connected to a data port of the secondary unit central control module. The secondary unit central control module controls the on and off of the electronic control switch Q9, so as to control the operation of the indicator LED1, the indicator LED2, and the indicator LED3. In the present embodiment, the electronic control switch Q9 may adopt such as a PNP type triode, a NPN type triode, a field-effect transistor, controllable silicon, or other components that are able to control its on and off by electronic means. In the present embodiment, a triode is taken as an example, a base of the triode is connected to the data port of the secondary unit central control module via a current limiting resistor R29.

Figure 26:
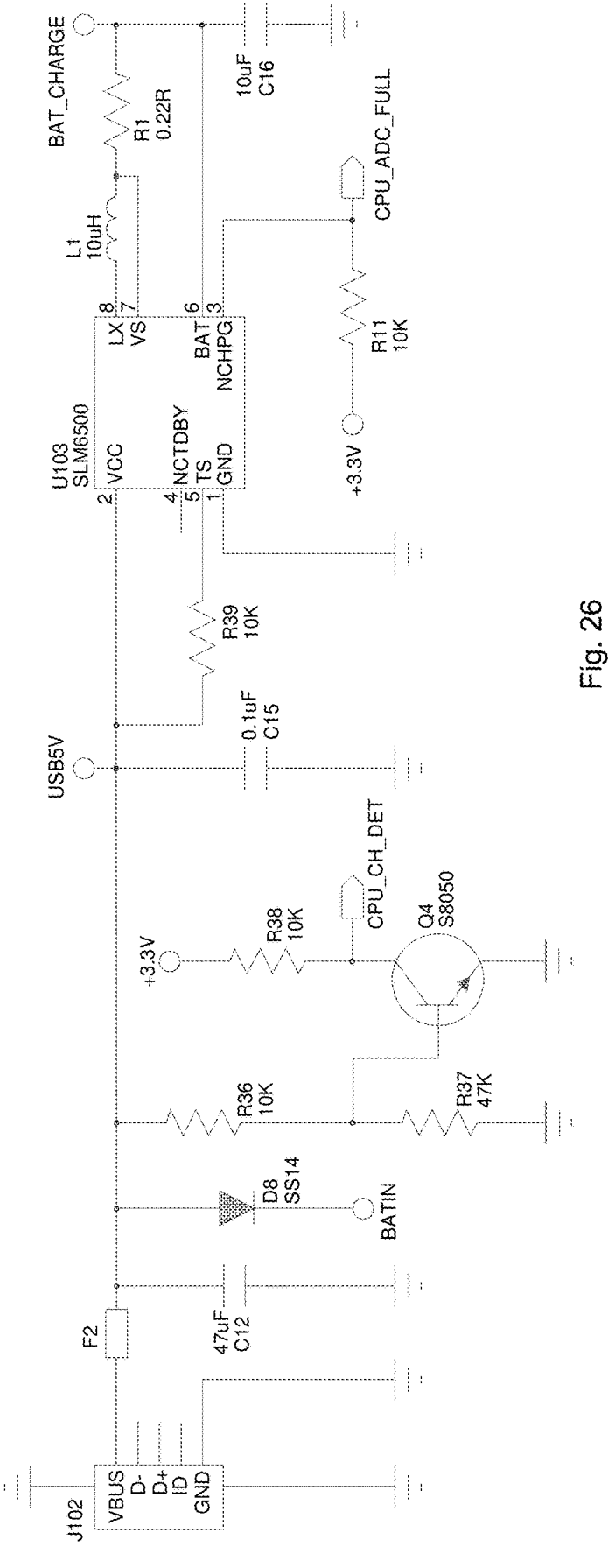
FIG. 26 is a circuit diagram of the secondary unit charging module of the present invention when the first signal processing device is the signal transmitting module.

In the present embodiment, referring to FIG. 26, the secondary unit power module includes a secondary unit USB interface (this interface is denoted by J102 when the first signal processing device is the signal transmitting module), a secondary unit charging management module (this module is denoted by U103 when the first signal processing device is the signal transmitting module), a secondary unit lithium battery, and a secondary unit power management device, the secondary unit USB interface is connected to a power input port of the secondary unit charging management module, the secondary unit lithium battery is connected to a power output port of the secondary unit charging management module, and the secondary unit lithium battery is charged via the secondary unit USB interface.

Figure 25:
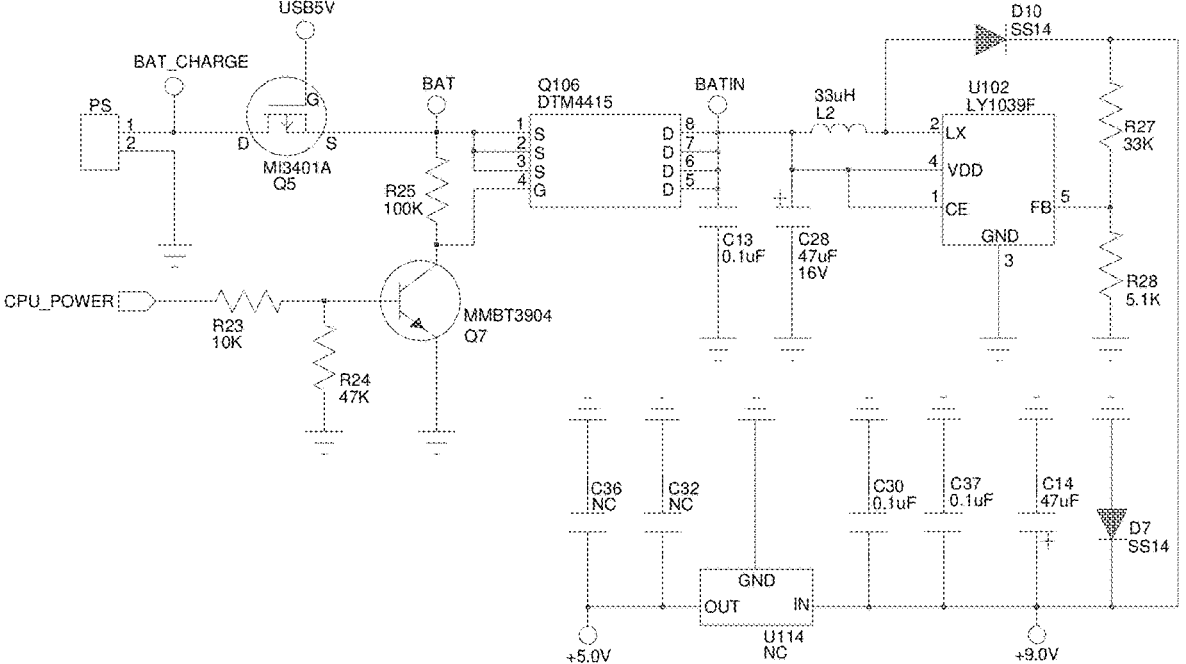
FIG. 25 is a circuit diagram of the secondary unit power module of the present invention when the first signal processing device is the signal transmitting module.

Referring to FIG. 25, when the first signal processing device is a signal transmitting module, the secondary unit power management device includes an MOSFET chip Q106, a secondary unit boost chip U102, a first secondary unit voltage regulator chip U114, and a second secondary unit voltage regulator chip U116, a power input port of the secondary unit boost chip U102 is connected to the secondary unit lithium battery via the MOSFET chip Q106, a voltage of the secondary unit lithium battery is converted to +9.0V for power supply via the secondary unit boost chip U102, +9.0V voltage is regulated to +5.0V via the first secondary unit voltage regulator chip U114 and then output to the secondary unit for power supply, and a voltage of the secondary unit lithium battery is regulated to +3.3V via the second secondary unit voltage regulator chip U116 and then output to the secondary unit for power supply.

When the first signal processing device is the signal processing module, the secondary unit power management device includes a secondary unit power management module, the secondary unit USB interface is connected to a power input port of the secondary unit charging management module, the secondary unit lithium battery is connected to a power output port of the secondary unit charging management module, the secondary unit USB interface is used to input power, the input power charges the secondary unit lithium battery via the secondary unit charging management module, a power input port of a secondary unit power management module is connected to the secondary unit lithium battery, the output power of the secondary unit lithium battery is converted to +9V for supplying power by the secondary unit power management module.

In the present embodiment, referring to FIG. 27, when the first signal processing device is the signal transmitting module, a positive electrode of the secondary unit lithium battery is connected with a secondary unit battery voltage detection module for detecting the voltage of the lithium battery, the secondary unit battery voltage detection module includes a resistor R33 and a resistor R34 connected in series, and a common end between the resistor R33 and the resistor R34 is connected to a data port of the secondary unit central control module.

When in use, the emitting circuit of the present disclosure adopts a set output frequency 125 KHz. The timing and size of the output signal is controlled by the electronic switch U108, which is isolated from the power grid by isolation transformer TR1 to achieve the purpose of test that is able to be connected to electrified cables. Different arrangements of receiving coil L31, receiving coil L32, and receiving coil L33 in the space position achieve a full range of signal detection in the X-axis, Y-axis, and Z-axis directions, and the receiving circuit collects, amplifies, and modulates the signal in all directions from the X-axis, Y-axis, and Z-axis directions.

In the present embodiment, referring to FIG. 41, when the first signal processing device is the signal processing module, the primary unit further includes a power-on indicator module, the power-on indicator module includes a bi-color light-emitting diode LED100 and an MOS transistor Q210, a gate of the MOS transistor Q210 is connected to a BTA_CHAR interface of the primary unit charging management module, a source of the MOS transistor Q210 is connected to a positive power port of a USB interface, a drain of the MOS transistor Q210 is connected to one bi-color light-emitting diode LED100, and the other bi-color light-emitting diode LED100 is connected to a +9V power supply. When power is applied, a corresponding LED in the bi-color light-emitting diode LED100 lights up.

Figure 40:
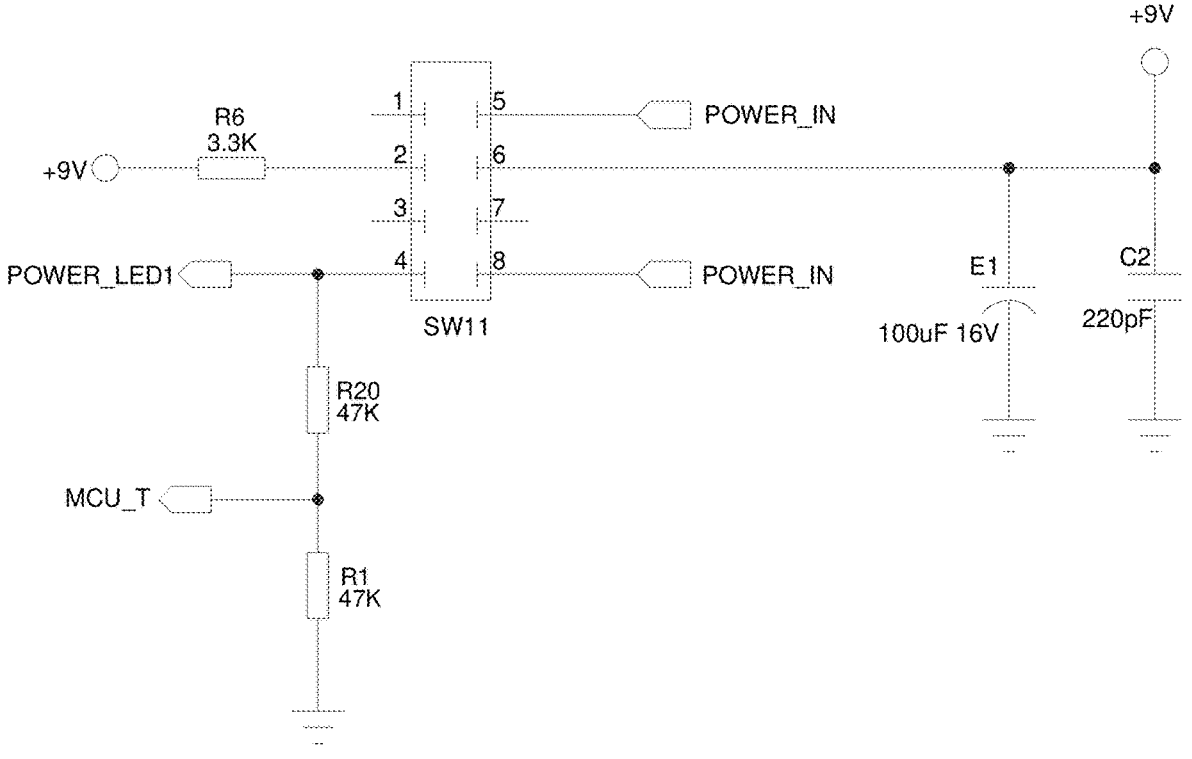
FIG. 40 is a circuit diagram of the primary unit switch module of the present invention when the first signal processing device is the signal processing module.

In the present embodiment, referring to FIGS. 37 and 40, when the first signal processing device is the signal processing module, the primary unit further includes a switch SW11, an output port of the primary unit power management module is connected to a work indicator LED11 via the switch SW11, and the work indicator LED11 is connected to the signal transmitting module, so as to indicate a working condition of the primary unit.

Figure 45:
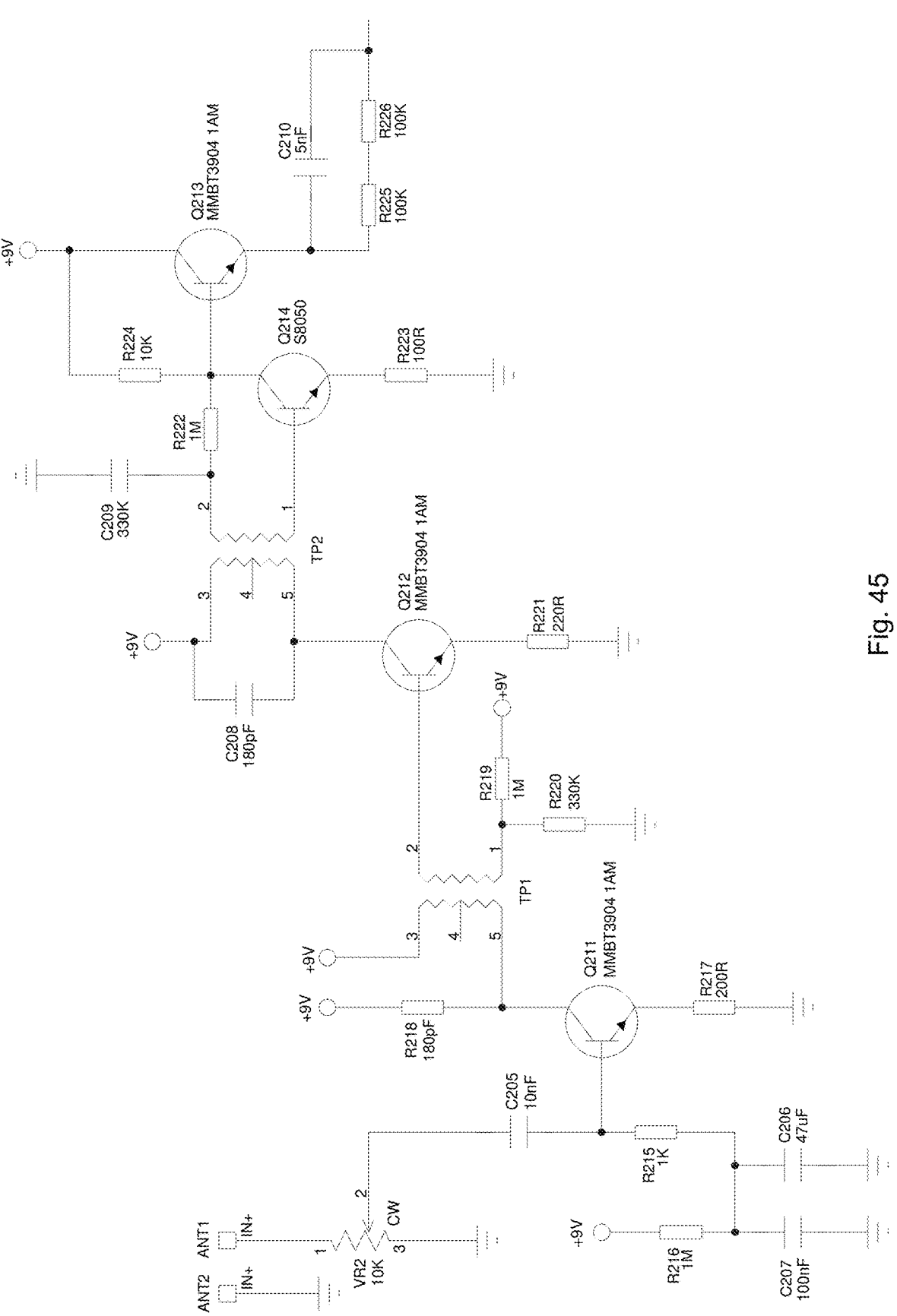
FIG. 45 is a circuit diagram of the secondary unit filter module of the present invention when the first signal processing device is the signal processing module.
Figure 46:
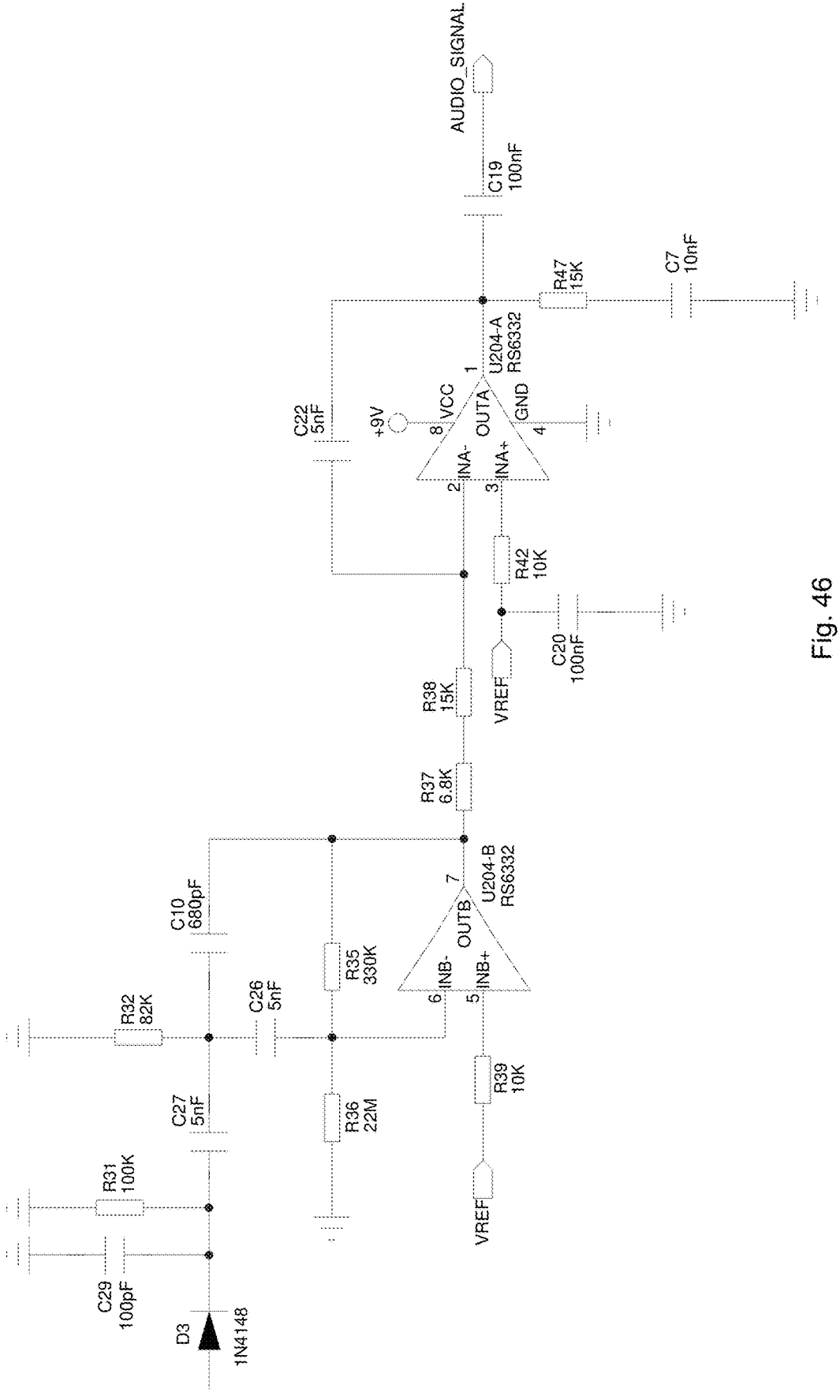
FIG. 46 is a circuit diagram of the secondary unit amplifier module of the present invention when the first signal processing device is the signal processing module.

In the present embodiment, referring to FIGS. 45 and 46, when the first signal processing device is the signal processing module, the probe interface is used to connect a signal receiving probe, the probe interface is grounded via a variable resistor VR2, a center tap of the variable resistor VR2 is grounded via a capacitor C205, a resistor R215, and a capacitor C206 sequentially connected in series, a resistor R216 and a capacitor C207 are connected in series between a +9V power supply and ground, a common end between the resistor R216 and the capacitor C207 is connected to a common end between the resistor R215 and the capacitor C206, the capacitor C205 and the resistor R215 are connected to a base of a triode Q211, an emitter of the triode Q211 is grounded via a resistor R217, a collector of the triode Q211 is connected to a +9V power supply via a resistor R218, the collector of the triode Q211 is connected to a port of a primary coil of an intermediate-frequency transformer TP1, an opposite port of the primary coil of the intermediate-frequency transformer TP1 is connected to a +9V power supply, a port of a secondary coil of the intermediate-frequency transformer TP1 is connected to a +9V power supply via a resistor R219, the same port thereof is further grounded via a resistor R220, an opposite port of the secondary coil of the intermediate-frequency transformer TP1 is connected to a base of a triode Q212, an emitter of the triode Q212 is grounded via a resistor R221, a collector of the triode Q212 is connected to a port of a primary coil of the intermediate-frequency transformer TP2, an opposite port of the primary coil of the intermediate-frequency transformer TP2 is connected to a +9V power supply, a capacitor C208 is connected in parallel between two ports of the primary coil of the intermediate-frequency transformer TP2, a port of a secondary coil of the intermediate-frequency transformer TP2 is grounded via a capacitor C209, the same port thereof is further connected to a base of a triode Q213 via a resistor R222, an opposite port of the secondary coil of the intermediate-frequency transformer TP2 is connected to a base of a triode Q214, an emitter of the triode Q214 is grounded via a resistor R223, a collector of the triode Q214 is connected to a +9V power supply via a resistor R224, a collector of the triode Q213 is connected to a +9V power supply, an emitter of the triode Q213 is connected to the amplifier module via a resistor R225, a resistor R226, and a diode D3 connected in series, and the capacitor C210 is connected in parallel to the series-connected resistor R225 and the resistor R226. The intermediate-frequency transformer is a transformer with a fixed resonance circuit unique to the superheterodyne receiver. However, the resonance circuit may be fine-tuned within a certain range so that an accurate resonance frequency may still be achieved after accessing the circuit, and the fine-tuning is accomplished with the assistance of a fine-tuning capacitor or a change in the relative position of the magnetic core.

Referring to FIGS. 44 and 46, input intermediate-frequency transformer TP1 and the output intermediate-frequency transformer TP2 select a frequency close to the emitted output signal, e.g., center frequency of 455 KHz. The small signal detected by the probe is filtered and adjusted for frequency selection by the input intermediate-frequency transformer TP1 and the output intermediate-frequency transformer TP2 to obtain a pure received signal, and the signal is amplified under the action of the amplifier U204. The amplified signal accomplishes the conversion from an electrical signal to a sound signal under the action of the audio power amplifier U101 and the speaker.

Figure 43:
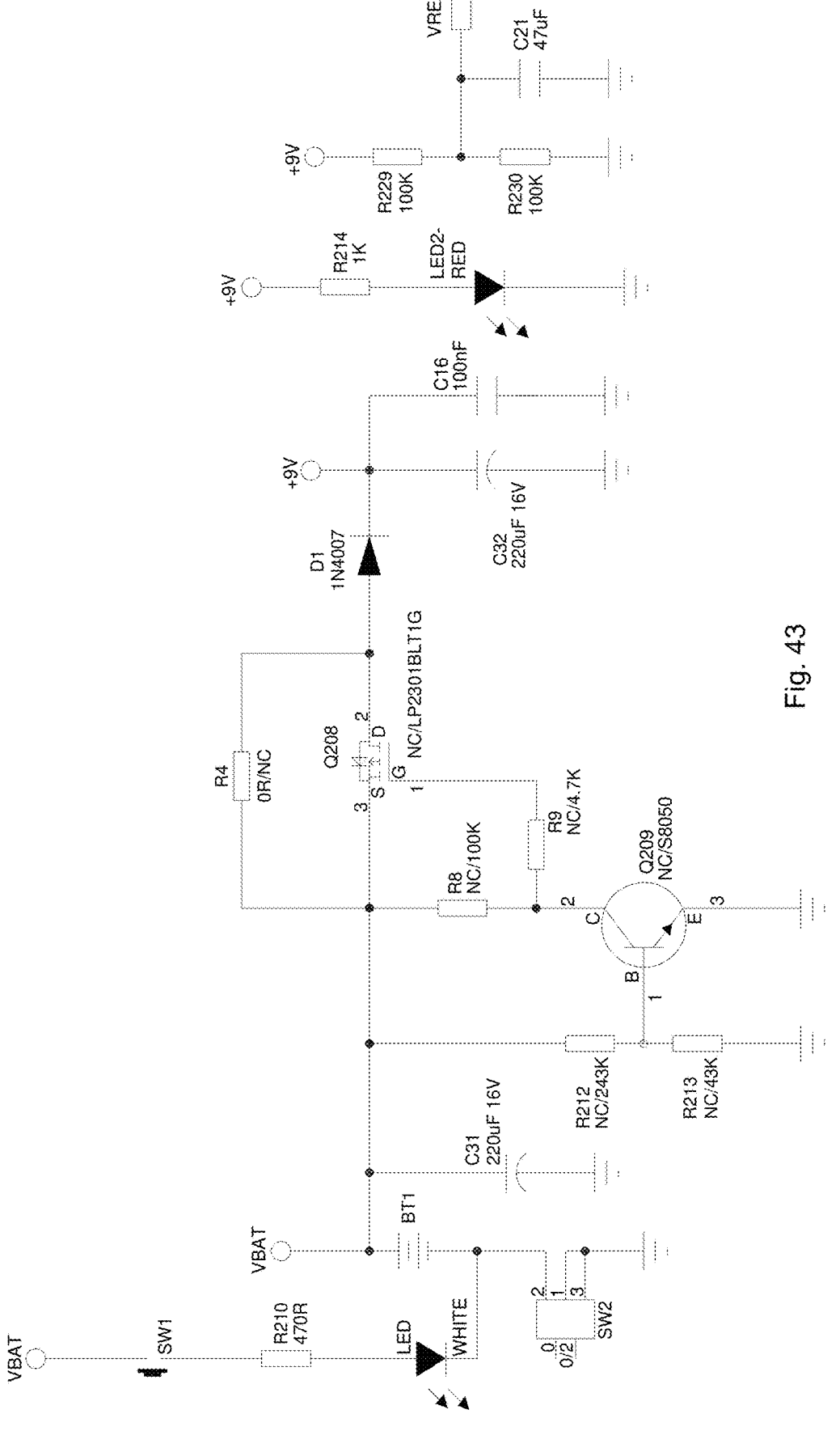
FIG. 43 is a circuit diagram of the secondary unit power switch module of the present invention when the first signal processing device is the signal processing module.

In the present embodiment, referring to FIGS. 43 and 46, the amplifier module adopts a two-stage amplifier connected by the operational amplifier U204 of model RS6332, the output signal from the emitter of triode Q212 is amplified and output to the alarm module, and the +9V power supply provides the reference voltage for the non-inverting input of the operational amplifier U204 after dividing the voltage via a voltage divider resistor R229 and a voltage divider resistor R230.

In the present embodiment, referring to FIG. 44, the alarm module includes an audio power amplifier U101 and a speaker BZ1, an output port of the amplifier module is connected to a signal input port of the audio power amplifier U101, and an output port of the audio power amplifier U101 is connected to the speaker BZ1.

Figure 47:
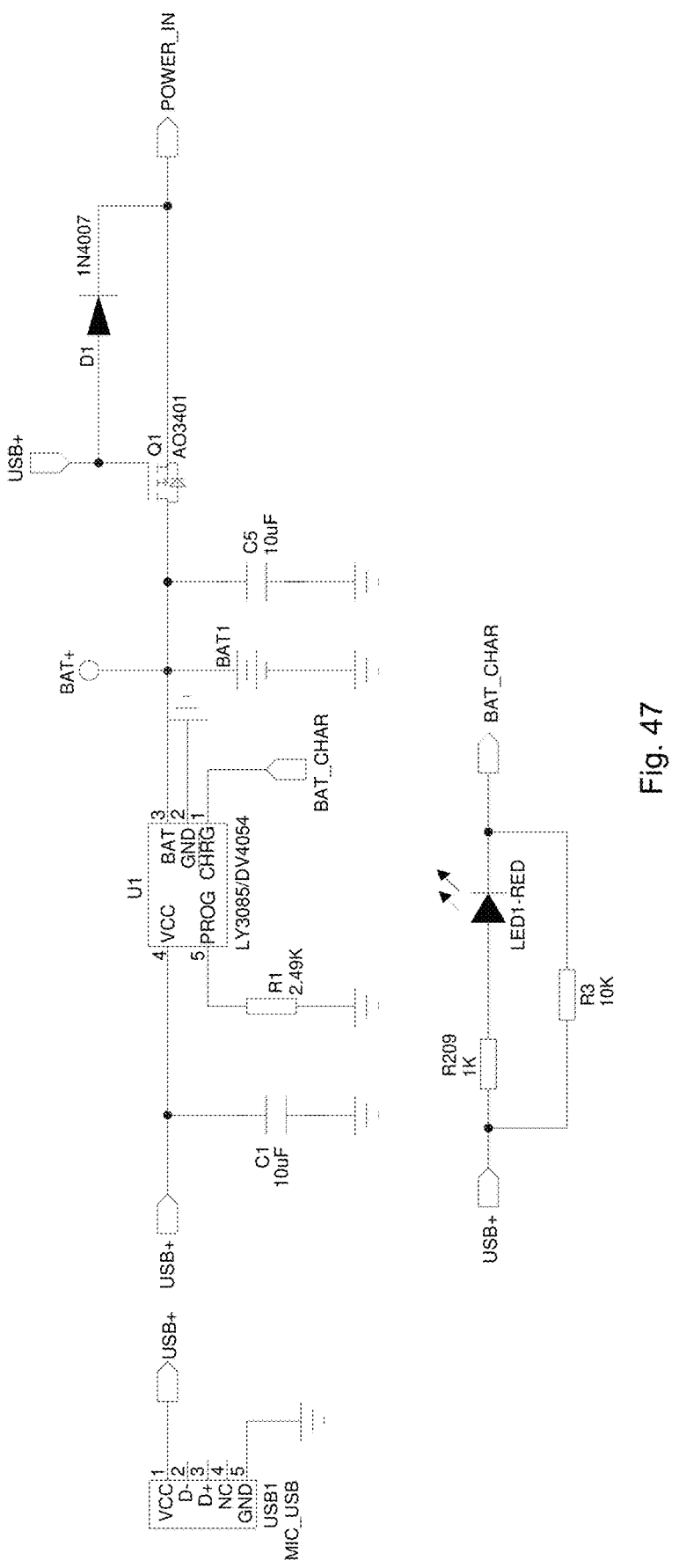
FIG. 47 is a circuit diagram of the secondary unit charging management module of the present invention when the first signal processing device is the signal processing module.
Figure 48:
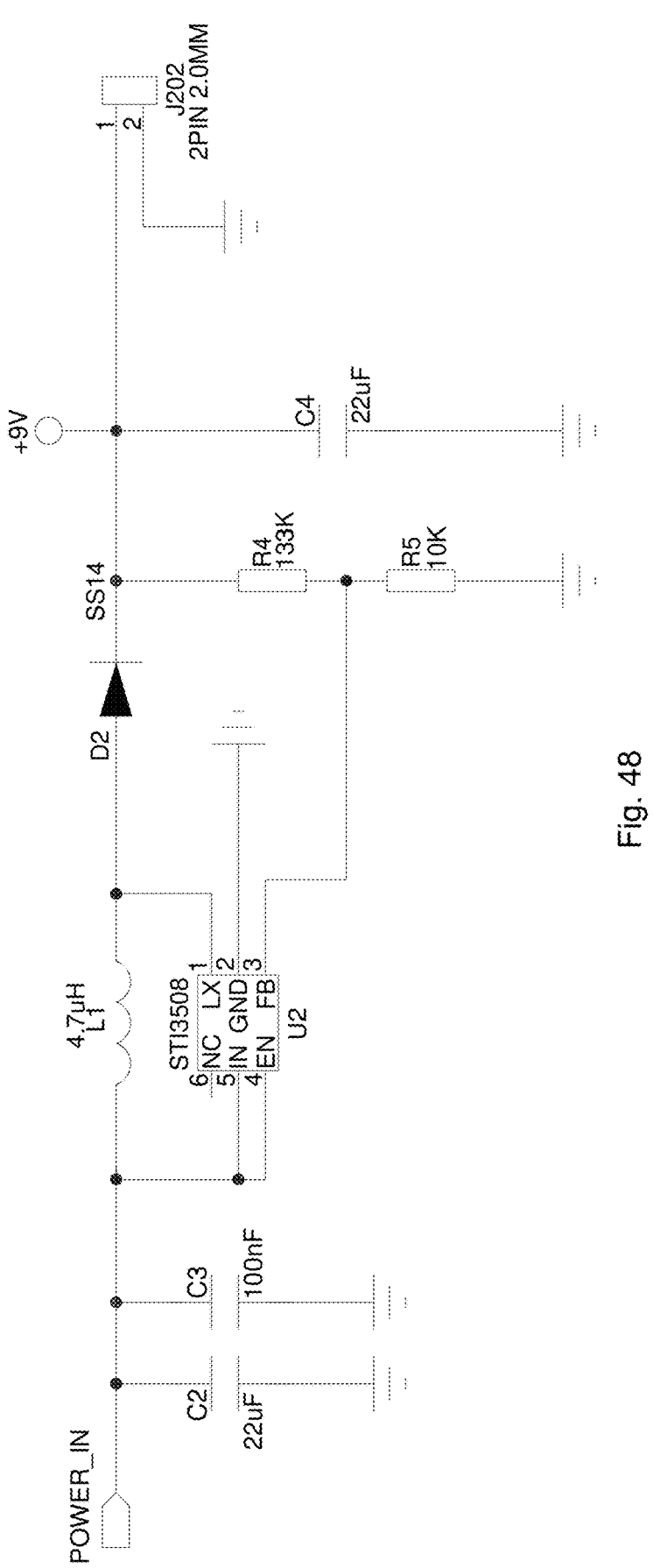
FIG. 48 is a circuit diagram of the secondary unit boost module of the present invention when the first signal processing device is the signal processing module.

In the present embodiment, referring to FIG. 47, when the first signal processing device is the signal processing module, the secondary unit further includes a secondary unit charging indicator module, the secondary unit charging indicator module includes a resistor R209 and a light-emitting diode LED1-RED, and the resistor R209 and the light-emitting diode LED1-RED are connected in series between a BTA_CHAR interface of a secondary unit charging management module and a positive power port of a USB interface.

In the present embodiment, referring to FIG. 43, the secondary unit power module further includes a +9V battery, a switch SW1, a resistor R210, and a light-emitting diode LED are sequentially connected in series between a positive electrode and a negative electrode of the +9V battery, a switch SW2 is connected between the negative electrode of the +9V battery and ground, the positive electrode of the +9V battery is connected to a source of an MOS transistor Q208, a drain of the MOS transistor Q208 outputs a +9V power supply, a gate of the MOS transistor Q208 is connected to a collector of a triode Q209 via a resistor R211, an emitter of the triode Q209 is grounded, a base of the triode Q209 is connected to a common end between a resistor R212 and a resistor R213, the resistor R212 and the resistor R213 are connected in series between the positive electrode of the +9V battery and ground, and a resistor R214 and a light-emitting diode LED2-RED are connected in series between the positive electrode of the +9V battery and ground.

Figure 49:
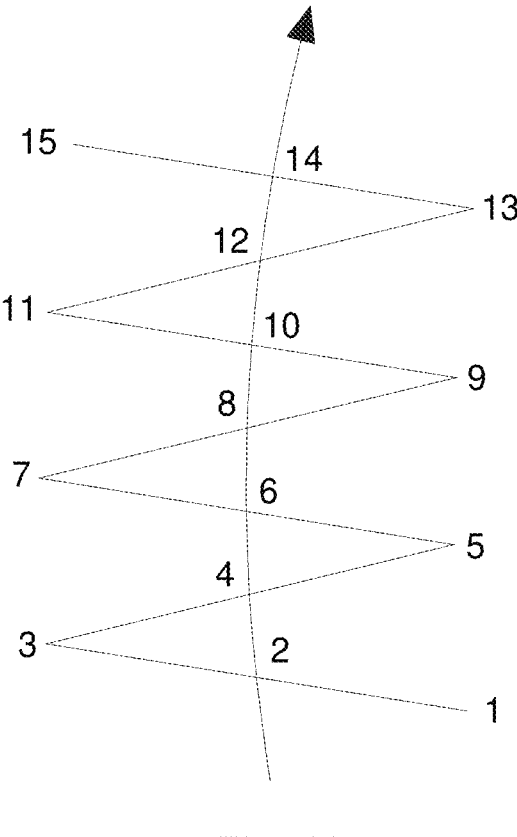
FIG. 49 is a schematic diagram of the receiving circuit of the present invention determining the cable path when the first signal processing device is the signal processing module.

When the first signal processing device is the signal processing module, the principle of the test is to connect the emitting probe of the emitting circuit to a port of the underground cable, and add an audio signal to the underground cable, so that a magnetic field is generated around the underground cable under test and transmitted to the ground through the earth. Hold the receiver in your hand, let the probe hang freely, move the probe position, and the probe coil cuts the magnetic lines. As the distance from the underground cable is farther, the distribution of magnetic lines is sparser, and the received signal is weaker. Therefore, it is possible to determine an approximate location range of the underground cable with a larger sensitivity first, and then continuously reduce the sensitivity to narrow down the approximate location range of the underground cable again, and ultimately to determine the exact location of the underground cable. Referring to FIG. 49, the receiving circuit is able to receive a signal when it is at position 1. When the sensitivity is adjusted to a lower level, the signal will no longer be received at position 1. When moving the receiving probe towards the cable, the receiving circuit receives the signal again. By repeating the reduction of the sensitivity continuously again to the place where the signal is able to be received, it is possible to narrow down the possible range of the underground cables and finally confirm the location of the underground cables.

When in use, referring to FIGS. 36 and 37, when the first signal processing device is the signal processing module, the tester includes signal emitting and signal receiving: when the emitting signal is emitted, the PWM wave (MCU_S-CAN) with a specific frequency (455 KHz) issued by the microcontroller is utilized to quickly and intermittently allow the MOS transistor Q207 to conduct and cut off, so as to amplify the output signal, and the MOS transistor Q204 and the MOS transistor Q205 adopt push-pull circuits, so as to reduce the conduction loss, improve the efficiency, and increase the circuit's loading capacity while also improving the switching speed. The signal is output to the triode Q206 via the LC frequency selection network, where the signal is amplified under the action of the triode Q206 and selected again under the action of the capacitor C202 and the inductor L203, and then the signal is output to the probe, where the size of the output signal is controlled by the variable resistor VR1 connected in series with the emitter of the triode Q203. When receiving a signal, the receiving circuit takes the received weak signal and adjusts the signal sensitivity of the receiving circuit by means of the variable resistor VR1. The received signal is transmitted to the input intermediate-frequency transformer TP1, the input intermediate-frequency transformer TP1 serves to couple the signal transmitted from the probe to the resonant circuit, and to regulate the frequency selection (adjustments), and the loop inductance parameter achieves the effect of filtering out the interference and amplifying the size of the signal. The signal processed by the input intermediate-frequency transformer TP1 is coupled to the output intermediate-frequency transformer TP2, the output intermediate-frequency transformer TP2 mainly serves to change the turn relationship of the coils and change the phase balance of the speaker BZ1, so that the sound generated by the audio current discharged by the speaker BZ1 matches the waveforms received by the probe, resulting in a clear and noiseless audio output. The tiny signal processed by the output intermediate-frequency transformer TP2 needs to be amplified by the amplifier U4 and fed into the audio power amplifier U101, which then drives the speaker BZ1 to issue an audio alert.

The present invention may add a set frequency signal to the power grid, and the signal is received by the receiving probe and amplified, so as to test the underground cable path. The present disclosure achieves that regardless of whether the underground cable is charged or not, the cable path is detectable, which solves the inconvenient factors brought by the ordinary underground cable requirement of not being charged. The emitter and receiver are designed in a small and delicate structure, which is simple to operate and solves the deficiencies of the previous need for bulky instruments and equipment, the operation of many people and the need to find both ports of the target cable in order to determine the path of the cable. The present disclosure allows for accurate searching and detection of the path and depth of underground cables without destroying the ground.

The invention claimed is:

1. An underground cable path tester, comprising a primary unit and a secondary unit, wherein:

the primary unit comprises a primary unit central control module, a first signal processing device, a second signal processing device, and a primary unit power module, the first signal processing device is connected to a data port of the primary unit central control module, the second signal processing device is connected to an output port of the first signal processing device, the primary unit power module is used to supply power for the primary unit, the second signal processing device is a signal transmitting interface when the first signal processing device is a signal transmitting module, and the second signal processing device is a signal emitting module when the first signal processing device is a signal processing module;

the secondary unit comprises a secondary unit processing device and a secondary unit power module, the secondary unit processing device comprises a first secondary unit processing device or a second secondary unit processing device, the first secondary unit processing device corresponds to the signal transmitting module, and the second secondary unit processing device corresponds to the signal processing module;

the first secondary unit processing device comprises a secondary unit central control module, a signal receiving module, a signal amplifying module, and a phase-locked loop module, the signal receiving module is connected to the signal amplifying module, an output port of the signal amplifying module is connected to the phase-locked loop module, and the phase-locked loop module is connected to a data port of the secondary unit central control module;

the second secondary unit processing device comprises a probe interface, a filter module, an amplifier module, and an alarm module, the probe interface is connected to an input port of the filter module, an output port of the filter module is connected to an input port of the amplifier module, and the output port of the amplifier module is connected to an input port of the alarm module; and the secondary unit power module is used to supply power for the secondary unit.

2. The underground cable path tester according to claim 1, wherein: when the first signal processing device is the signal transmitting module, the first signal processing device comprises a dual-D flip-flop U6, an operational amplifier U7, an electronic switch U108, a triode Q11, a triode Q13, and an isolation transformer TR1, an interior of the dual-D flip-flop U6 comprises a D flip-flop U6-A and a D flip-flop U6-B, an interior of the operational amplifier U7 includes an operational amplifier U7-A and an operational amplifier U7-B, a data port of the central control module is connected to an input port of the D flip-flop U6-B, an output port of the D flip-flop U6-B is connected to an input port of the D flip-flop U6-A, an output port of the D flip-flop U6-A is connected to an input port of the operational amplifier U7-A, an output port of the operational amplifier U7-A is connected to an I/O port B of the electronic switch U108, the I/O port B of the electronic switch U108 is connected to an I/O port A of the electronic switch U108, the I/O port A of the electronic switch U108 is connected to an input port of the operational amplifier U7-B, a 9.0V power supply is connected to ground via a resistor R56 and a resistor R55, a common end between the resistor R56 and the resistor R55 is connected to the I/O port A of the electronic switch U108, a collector of the triode Q11 is connected to a 9.0V power supply, an emitter of the triode Q11 is connected to an emitter of the triode Q13, a collector of the triode Q13 is grounded, a base of the triode Q11 is connected to a base of the triode Q13, an output port of the operational amplifier U7-B is connected to the base of the triode Q11 and the base of the triode Q13, the output port of the operational amplifier U7-B is connected to the emitter of the triode Q11 and the emitter of the triode Q13 via a resistor R64, the emitter of the triode Q11 and the emitter of the triode Q13 are connected to a primary coil of the isolation transformer TR1 through a capacitor C11 and an inductor L3 connected in series, and the secondary coil of the isolation transformer TR1 is connected to an interface J3-1;

when the first signal processing device is the signal processing module, the signal processing module comprises an MOS transistor Q207, an MOS transistor Q204, an MOS transistor Q205, a triode Q206 and a triode Q203, a gate of the MOS transistor Q207 is a signal input port of the signal processing module, the gate of the MOS transistor Q207 is connected to a data port of the central control module via a resistor R201, a source of the MOS transistor Q207 is grounded, a drain of the MOS transistor Q207 is connected to a +9V power supply via a resistor R202, gates of the MOS transistor Q204 and the MOS transistor Q205 are connected to the drain of the MOS transistor Q207 respectively, a drain of the MOS transistor Q204 is connected to a +9V power supply, a drain of the MOS transistor Q205 is grounded, a source of the MOS transistor Q204 is connected to a source of the MOS transistor Q205, the source of the MOS transistor Q204 is connected to a base of the triode Q206 via a resistor R203 and a resistor R204 connected in series, a capacitor C201 and an inductor L201 are connected in series, the capacitor C201 and the inductor L201 connected in series are connected to a resistor R204 in parallel, a base of the triode Q206 is connected to a +9V power supply via a resistor R205, an emitter of the triode Q206 is grounded via a resistor R206, a collector of the triode Q206 is connected to a +9V power supply via a resistor R201 and an inductor L202 connected in series, the collector of the triode Q206 is connected to a base of the triode Q203 via a capacitor C202 and an inductor L203 connected in series, an emitter of the triode Q203 is grounded via a variable resistor VR1, a center tap of the variable resistor VR1 is grounded via a resistor R207, a collector of the triode Q203 is connected to a +9V power supply via an inductor L204, a base of the triode Q203 is connected to the signal emitting module via a resistor R208, an inductor L205, a capacitor C203, and a thermistor PTC1 sequentially connected in series, a common end between the resistor R208 and the inductor L205 is connected to the collector of the triode Q203, and a common end between the capacitor C203 and the thermistor PTC1 is grounded via a capacitor C204 and an inductor L206 connected in series.

3. The underground cable path tester according to claim 1, wherein: when the first signal processing device is a signal transmitting module, a data port of the primary unit central control module is connected with a primary unit electronic control switch, the primary unit electronic control switch comprises a triode Q31, a triode Q32, and a triode Q33, bases of the triode Q31, the triode Q32, and the triode Q33 are connected to data ports of the primary unit central control module respectively, emitters of the triode Q31, the triode Q32, and the triode Q33 are grounded respectively, and collectors of the triode Q31, the triode Q32, and the triode Q33 are connected a control port of an electronic switch U108 respectively.

4. The underground cable path tester according to claim 1, wherein: when the first signal processing device is the signal transmitting module, the primary unit further comprises a signal feedback module, the signal feedback module comprises an operational amplifier U1, an operational amplifier U9, an operational amplifier U12-A, and an operational amplifier U12-B, the operational amplifier U1, operational amplifier U9, operational amplifier U12-A, and operational amplifier U12-B are connected in sequence to form a four-stage amplification system, a signal input port of the signal feedback module is connected to a primary coil of an isolation transformer TR1, and an output port of the signal feedback module is connected to a data port of the primary unit central control module.

5. The underground cable path tester according to claim 1, wherein: when the first signal processing device is a signal transmitting module, the signal receiving module comprises a receiving coil L31, a receiving coil L32, and a receiving coil L33, the signal amplifying module comprises an X-axis primary amplifying module, a Y-axis primary amplifying module, a Z-axis primary amplifying module, an X-axis secondary amplifying module, a Y-axis secondary amplifying module, and a Z-axis secondary amplifying module, and the phase-locked loop module comprises an X-axis phase-locked loop module, a Y-axis phase-locked loop module, and a Z-axis phase-locked loop module; the receiving coil L31 is connected to an input port of the X-axis primary amplifying module, the X-axis primary amplifying module comprises an operational amplifier U1-A and an operational amplifier U1-B, the operational amplifier U1-A and the operational amplifier U1-B are connected to form a two-stage amplification circuit, the X-axis primary amplifying module is connected to the X-axis secondary amplifying module via an interface J1, the X-axis secondary amplifying module comprises an operational amplifier U8-A and an operational amplifier U8-B, the operational amplifier U8-A and the operational amplifier U8-B are connected to form a two-stage amplification circuit, one branch of an output port of the X-axis secondary amplifying module is connected to a data port of the secondary unit central control module, another branch of the output port of the X-axis secondary amplifying module is connected to an input port of the X-axis phase-locked loop module, an output port of the X-axis phase-locked loop module is connected to a data port of the secondary unit central control module, a clock signal port of the X-axis phase-locked loop module is connected to an X-axis channel selector U20, and a control port of the X-axis channel selector U20 is connected to a data port of the secondary unit central control module;

the receiving coil L32 is connected to an input port of the Y-axis primary amplifying module, the Y-axis primary amplifying module comprises an operational amplifier U2-A and an operational amplifier U2-B, the operational amplifier U2-A and the operational amplifier U2-B are connected to form a two-stage amplification circuit, the Y-axis primary amplifying module is connected to the Y-axis secondary amplifying module via an interface J1, the Y-axis secondary amplifying module comprises an operational amplifier U9-A and an operational amplifier U9-B, the operational amplifier U9-A and the operational amplifier U9-B are connected to form a two-stage amplification circuit, one branch of an output port of the Y-axis secondary amplifying module is connected to a data port of the secondary unit central control module, another branch of the output port of the Y-axis secondary amplifying module is connected to an input port of the Y-axis phase-locked loop module, an output port of the Y-axis phase-locked loop module is connected to a data port of the secondary unit central control module, a clock signal port of the Y-axis phase-locked loop module is connected to an Y-axis channel selector U13, and a control port of the Y-axis channel selector U13 is connected to a data port of the secondary unit central control module; and the receiving coil L33 is connected to an input port of the Z-axis primary amplifying module, the Z-axis primary amplifying module comprises an operational amplifier U3-A and an operational amplifier U3-B, the operational amplifier U3-A and the operational amplifier U3-B are connected to form a two-stage amplification circuit, the Z-axis primary amplifying module is connected to the Z-axis secondary amplifying module via an interface J1, the Z-axis secondary amplifying module comprises an operational amplifier U10-A and an operational amplifier U10-B, the operational amplifier U10-A and the operational amplifier U10-B are connected to form a two-stage amplification circuit, one branch of an output port of the Z-axis secondary amplifying module is connected to a data port of the secondary unit central control module, another branch of the output port of the Z-axis secondary amplifying module is connected to an input port of the Z-axis phase-locked loop module, an output port of the Z-axis phase-locked loop module is connected to a data port of the secondary unit central control module, a clock signal port of the Z-axis phase-locked loop module is connected to an Z-axis channel selector U10, and a control port of the Z-axis channel selector U10 is connected to a data port of the secondary unit central control module.

6. The underground cable path tester according to claim 1, wherein: when the first signal processing device is the signal transmitting module, the secondary unit further comprises a wireless voltage detection module, the wireless voltage detection module comprises an NCV coil, an operational amplifier U4-B, and an operational amplifier U14, the NCV coil is connected to an input port of the operational amplifier U4-B, an output of the operational amplifier U4-B is connected to an input port of the operational amplifier U14, and an output port of the operational amplifier U14 is connected to a data port of the secondary unit central control module.

7. The underground cable path tester according to claim 1, wherein: when the first signal processing device is the signal transmitting module, a data port of the secondary unit central control module is connected with an audio amplifier chip U15, and an output port of the audio amplifier chip U15 is connected with a speaker; and when the first signal processing device is the signal processing module, the alarm module comprises an audio power amplifier U101 and a speaker BZ1, an output port of the amplifier module is connected to a signal input port of the audio power amplifier U101, and an output port of the audio power amplifier U101 is connected to the speaker BZ1.

8. The underground cable path tester according to claim 1, wherein: when the first signal processing device is the signal transmitting module, a crystal oscillator module is connected between an OSC_IN interface and an OSC_OUT interface of the primary unit central control module, and between an OSC_IN interface and an OSC_OUT interface of the secondary unit central control module respectively, a power-on reset module is connected to an NRST interface of the primary unit central control module and an NRST interface of the secondary unit central control module respectively, wherein the power-on reset module comprises a capacitor and a resistor, the capacitor is connected between ground and the NRST interface of the corresponding central control module, and the resistor is connected between a positive power supply and the NRST interface of the corresponding central control module;

a display module is connected to a data port of the primary unit central control module and a data port of the secondary unit central control module respectively;

a backlight module is connected to the data port of the primary unit central control module and the data port of the secondary unit central control module respectively, wherein the backlight module comprises a current limiting resistor R22, an electronic control switch Q10, and a backlight interface CON2, the current limiting resistor R22, the backlight interface CON2, and the electronic control switch Q10 are sequentially connected in series between the positive power supply and the ground, and a control port of the electronic control switch Q10 is connected to a data port of the corresponding central control module;

a key module is connected to the data port of the primary unit central control module and the data port of the secondary unit central control module respectively, wherein the key module comprises a key switch S1, a key switch S2, a key switch S3, a key switch S4, a key switch S5, a key switch S6, a key switch S7, and a key switch S8, and the key switch S1, the key switch S2, the key switch S3, the key switch S4, the key switch S5, the key switch S6, the key switch S7, and the key switch S8 are connected between the data port of the corresponding central control module and ground, respectively;

a buzzer module is connected to the data port of the primary unit central control module and the data port of the secondary unit central control module respectively, wherein the buzzer module comprises a buzzer and an electronic control switch Q12, the buzzer and the electronic control switch Q12 are connected in series between the positive power supply and ground, and a control port of the electronic control switch Q12 is connected to a data port of the corresponding central control module; and a work indicator module is connected to the data port of the primary unit central control module and the data port of the secondary unit central control module respectively, wherein the work indicator module comprises a current limiting resistor R30, a current limiting resistor R31, a current limiting resistor R32, an electronic control switch Q9, an indicator light LED1, an indicator light LED2, and an indicator light LED3, the current limiting resistor R32 and the indicator light LED1 are connected in series, the current limiting resistor R31 and the indicator light LED2 are connected in series, the current limiting resistor R30 and the indicator light LED3 are connected in series, the series-connected current limiting resistor R32 and the indicator light LED1, the series-connected current limiting resistor R31 and the indicator light LED2, and the series-connected current limiting resistor R30 and the indicator light LED3 are connected in parallel and are connected between the positive power supply and ground via the electronic control switch Q9, and a control port of the electronic control switch Q9 is connected to a data port of the corresponding central control module.

9. The underground cable path tester according to claim 1, wherein the primary unit power module comprises a primary unit USB interface, a primary unit charging management module, a primary unit lithium battery, and a primary unit power management device, the primary unit USB interface is connected to a power input port of the primary unit charging management module, the primary unit lithium battery is connected to a power output port of the primary unit charging management module, and the primary unit lithium battery is charged via the primary unit USB interface;

a positive electrode of the primary unit lithium battery is connected with a primary unit battery voltage detection module, the primary unit battery voltage detection module comprises two resistors connected in series, and a common end between two resistors is connected to a data port of the primary unit central control module; when the first signal processing device is the signal transmitting module, a positive electrode of the secondary unit lithium battery is connected with a secondary unit battery voltage detection module, the secondary unit battery voltage detection module comprises two resistors connected in series, and a common end between two resistors is connected to a data port of the secondary unit central control module;

when the first signal processing device is a signal transmitting module, the primary unit power management device comprises a primary unit boost chip U105 and a primary unit voltage regulator chip U104, a power input port of the primary unit boost chip U105 is connected to the primary unit lithium battery, a voltage of the primary unit lithium battery is converted to +9.0V for power supply via the primary unit boost chip U105, and +9.0V voltage is regulated to +3.3V via the primary unit voltage regulator chip U104 and then output to the primary unit for power supply; and when the first signal processing device is the signal processing module, the primary unit power management device comprises a primary unit power management module and a voltage regulator module.

10. The underground cable path tester according to claim 1, wherein: the secondary unit power module comprises a secondary unit USB interface, a secondary unit charging management module, a secondary unit lithium battery, and a secondary unit power management device, the secondary unit USB interface is connected to a power input port of the secondary unit charging management module, the secondary unit lithium battery is connected to a power output port of the secondary unit charging management module, and the secondary unit lithium battery is charged via the secondary unit USB interface;

when the first signal processing device is a signal transmitting module, the secondary unit power management device comprises an MOSFET chip Q106, a secondary unit boost chip U102, a first secondary unit voltage regulator chip U114, and a second secondary unit voltage regulator chip U116, a power input port of the secondary unit boost chip U102 is connected to the secondary unit lithium battery via the MOSFET chip Q106, a voltage of the secondary unit lithium battery is converted to +9.0V for power supply via the secondary unit boost chip U102, +9.0V voltage is regulated to +5.0V via the first secondary unit voltage regulator chip U114 and then output to the secondary unit for power supply, and a voltage of the secondary unit lithium battery is regulated to +3.3V via the second secondary unit voltage regulator chip U116 and then output to the secondary unit for power supply; and when the first signal processing device is the signal processing module, the secondary unit power management device comprises a secondary unit power management module.

11. The underground cable path tester according to claim 1, wherein: when the first signal processing device is the signal processing module, the secondary unit further comprises a secondary unit charging indicator module, the secondary unit charging indicator module comprises a resistor R209 and a light-emitting diode LED1-RED, and the resistor R209 and the light-emitting diode LED1-RED are connected in series between a BTA_CHAR interface of a secondary unit charging management module and a positive power port of a USB interface.

12. The underground cable path tester according to claim 1, wherein: when the first signal processing device is the signal processing module, the secondary unit power module further comprises a +9V battery, a switch SW1, a resistor R210, and a light-emitting diode LED are sequentially connected in series between a positive electrode and a negative electrode of the +9V battery, a switch SW2 is connected between the negative electrode of the +9V battery and ground, the positive electrode of the +9V battery is connected to a source of an MOS transistor Q208, a drain of the MOS transistor Q208 outputs a +9V power supply, a gate of the MOS transistor Q208 is connected to a collector of a triode Q209 via a resistor R211, an emitter of the triode Q209 is grounded, a base of the triode Q209 is connected to a common end between a resistor R212 and a resistor R213, the resistor R212 and the resistor R213 are connected in series between the positive electrode of the +9V battery and ground, and a resistor R214 and a light-emitting diode LED2-RED are connected in series between the positive electrode of the +9V battery and ground.

13. The underground cable path tester according to claim 1, wherein: when the first signal processing device is the signal processing module, the primary unit further comprises a power-on indicator module, the power-on indicator module comprises a bi-color light-emitting diode LED100 and an MOS transistor Q210, a gate of the MOS transistor Q210 is connected to a BTA_CHAR interface of the primary unit charging management module, a source of the MOS transistor Q210 is connected to a positive power port of a USB interface, a drain of the MOS transistor Q210 is connected to one bi-color light-emitting diode LED100, and the other bi-color light-emitting diode LED100 is connected to a +9V power supply.

14. The underground cable path tester according to claim 1, wherein: when the first signal processing device is the signal processing module, the primary unit further comprises a switch SW11, an output port of the primary unit power management module is connected to a work indicator LED11 via the switch SW11, and the work indicator LED11 is connected to the signal transmitting module.

15. The underground cable path tester according to claim 1, wherein: when the first signal processing device is the signal processing module, the probe interface is grounded via a variable resistor VR2, a center tap of the variable resistor VR2 is grounded via a capacitor C205, a resistor R215, and a capacitor C206 sequentially connected in series, a resistor R216 and a capacitor C207 are connected in series between a +9V power supply and ground, a common end between the resistor R216 and the capacitor C207 is connected to a common end between the resistor R215 and the capacitor C206, the capacitor C205 and the resistor R215 are connected to a base of a triode Q211, an emitter of the triode Q211 is grounded via a resistor R217, a collector of the triode Q211 is connected to a +9V power supply via a resistor R218, the collector of the triode Q211 is connected to a port of a primary coil of an intermediate-frequency transformer TP1, an opposite port of the primary coil of the intermediate-frequency transformer TP1 is connected to a +9V power supply, a port of a secondary coil of the intermediate-frequency transformer TP1 is connected to a +9V power supply via a resistor R219, the same port thereof is further grounded via a resistor R220, an opposite port of the secondary coil of the intermediate-frequency transformer TP1 is connected to a base of a triode Q212, an emitter of the triode Q212 is grounded via a resistor R221, a collector of the triode Q212 is connected to a port of a primary coil of the intermediate-frequency transformer TP2, an opposite port of the primary coil of the intermediate-frequency transformer TP2 is connected to a +9V power supply, a capacitor C208 is connected in parallel between two ports of the primary coil of the intermediate-frequency transformer TP2, a port of a secondary coil of the intermediate-frequency transformer TP2 is grounded via a capacitor C209, the same port thereof is further connected to a base of a triode Q213 via a resistor R222, an opposite port of the secondary coil of the intermediate-frequency transformer TP2 is connected to a base of a triode Q214, an emitter of the triode Q214 is grounded via a resistor R223, a collector of the triode Q214 is connected to a +9V power supply via a resistor R224, a collector of the triode Q213 is connected to a +9V power supply, an emitter of the triode Q213 is connected to the amplifier module via a resistor R225, a resistor R226, and a diode D3 connected in series, and the capacitor C210 is connected in parallel to the series-connected resistor R225 and the resistor R226.

\* \* \* \* \*